United States Patent
Miyamoto et al.

(10) Patent No.: US 7,041,430 B2
(45) Date of Patent: *May 9, 2006

(54) INFORMATION RECORDING MEDIA, MANUFACTURING TECHNIQUE AND INFORMATION RECORDING METHOD

(75) Inventors: Makoto Miyamoto, Ome (JP); Akemi Hirotsune, Saitama (JP); Toshimichi Shintani, Kodaira (JP); Takahiro Kurokawa, Kokubunji (JP); Keikichi Andoo, Musashino (JP); Yumiko Anzai, Ome (JP)

(73) Assignee: Hitachi, Ltd., Tokyo (JP)

( * ) Notice: Subject to any disclaimer, the term of this patent is extended or adjusted under 35 U.S.C. 154(b) by 140 days.

This patent is subject to a terminal disclaimer.

(21) Appl. No.: 10/219,585

(22) Filed: Aug. 16, 2002

(65) Prior Publication Data

US 2003/0174610 A1    Sep. 18, 2003

(30) Foreign Application Priority Data

Mar. 13, 2002  (JP)  ............................. P2002-067823

(51) Int. Cl.
*G11B 7/24* (2006.01)
*B32B 3/02* (2006.01)
*C23C 14/00* (2006.01)

(52) U.S. Cl. ................. 430/270.13; 430/945; 430/64.5; 430/913; 369/275.5; 427/162; 204/192.26; 204/192.29

(58) Field of Classification Search ........... 430/270.13; 428/64.1; 369/275.2
See application file for complete search history.

(56) References Cited

U.S. PATENT DOCUMENTS 5,089,358 A * 2/1992 Taki et al. ............ 428/694 DE
5,545,454 A * 8/1996 Yamada et al. ............ 428/64.1
5,688,574 A * 11/1997 Tamura et al. ............. 428/64.1

(Continued)

FOREIGN PATENT DOCUMENTS

EP    0373539    * 6/1990

(Continued)

OTHER PUBLICATIONS

Noboru Yamada, Mayumi Otoba, Kenichi Nagata, Shige'aki Furukawa, Kenji Narumi. Nobuo Akahira and Fumiaki Ueno. "Phase-Change Optical Disk with Nitride Interface Layers", SPIE, vol. 3401, pp. 24-32.
Abtract of CN 1313592 and Front Page of CN 1313592.

*Primary Examiner*—Martin Angebranndt
(74) *Attorney, Agent, or Firm*—Reed Smith LLP; Stanley P. Fisher, Esq.; Juan Carlos A. Marquez, Esq.

(57) ABSTRACT

Problem to be solved is that when an information recording medium is repeatedly subjected to recording of information several hundreds times, the atoms in a protective layer are diffused and dissolved into a recording layer to lower a reflectivity greatly and make the medium unendurable to many times of overwriting. This problem can be solved by a medium constituted of interference layer 10, interface layer 12, phase-change type recording layer 14, protective layer 13 having a tin content of from 23.3 atomic % to 32.3 atomic %, and a heat sink layer 8 successively formed on substrate 1, as seen from a light-incidence side. By use of this medium, the dissolution of atoms can be prevented, and overwriting for many times can be achieved.

12 Claims, 12 Drawing Sheets

U.S. PATENT DOCUMENTS

| | | | |
|---|---|---|---|
| 6,231,945 B1 * | 5/2001 | Miyamoto et al. ......... 428/64.1 |
| 6,703,098 B1 * | 3/2004 | Hirotsune et al. ......... 428/64.1 |
| 6,723,411 B1 * | 4/2004 | Hirotsune et al. ......... 428/64.1 |
| 6,854,126 B1 * | 2/2005 | Hirotsune et al. .......... 720/719 |
| 2001/0028938 A1 * | 10/2001 | Kojima et al. ............. 428/64.4 |
| 2002/0024913 A1 * | 2/2002 | Kojima et al. ................ 369/94 |

FOREIGN PATENT DOCUMENTS

| | | | |
|---|---|---|---|
| JP | 63-103453 | | 10/1986 |
| JP | 08/190734 | * | 7/1996 |
| JP | 10-275361 | | 3/1997 |
| JP | 10-302308 | | 4/1997 |
| WO | 99/13465 | * | 3/1999 |

\* cited by examiner

FIG. 1

| | COMPARISON EMBODIMENT 1 | COMPARISON EMBODIMENT 2 | COMPARISON EMBODIMENT 3 | COMPARISON EMBODIMENT 4 |
|---|---|---|---|---|
| METAL LAYER | Al99Ti1 | Al99Ti1 | Al99Ti1 | Al99Ti1 |
| ABSORPTION COMPENSATION LAYER | Cr90(Cr2O3)10 | Ge80Cr20 | Cr90(Cr2O3)10 | Cr90(Cr2O3)10 |
| SECOND INTERFERENCE LAYER | (ZnS)80(SiO2)20 | (ZnS)80(SiO2)20 | (ZnS)80(SiO2)20 | — |
| SECOND INTERFACE LAYER | Cr2O3 | Ge3N4 | — | Cr2O3 |
| RECORDING LAYER | Ge28Sb18Te54 | Ge28Sb18Te54 | Ge28Sb18Te54 | Ge28Sb18Te54 |
| FIRST INTERFACE LAYER | Cr2O3 | Ge3N4 | Cr2O3 | Cr2O3 |
| FIRST INTERFERENCE LAYER | (ZnS)80(SiO2)20 | (ZnS)80(SiO2)20 | (ZnS)80(SiO2)20 | (ZnS)80(SiO2)20 |
| JITTER | 8.2% | 8.4% | 11% | 10% |
| MODULATION | 56% | 55% | 60% | 38% |
| RECORDING POWER | 11.5mW | 12mW | 10.5mW | 14mW |
| OVERWRITE CYCLE TIMES | 100000 TIMES | 100000 TIMES | 100 TIMES | 2000 TIMES |

FIG. 2

| | COMPARISON EMBODIMENT 5 | COMPARISON EMBODIMENT 6 | EMBODIMENT 1 | EMBODIMENT 2 |
|---|---|---|---|---|
| METAL LAYER | Al99Ti1 | Al99Ti1 | Al99Ti1 | Al99Ti1 |
| ABSORPTION COMPENSATION LAYER | Cr90(Cr2O3)10 | Cr90(Cr2O3)10 | Cr90(Cr2O3)10 | Cr90(Cr2O3)10 |
| PROTECTIVE LAYER | ZnS | SnO2 | (SnO2)90(Cr2O3)10 | (SnO2)80(ZnS)20 |
| RECORDING LAYER | Ge28Sb18Te54 | Ge28Sb18Te54 | Ge28Sb18Te54 | Ge28Sb18Te54 |
| FIRST INTERFACE LAYER | Cr2O3 | Cr2O3 | Cr2O3 | Cr2O3 |
| FIRST INTERFERENCE LAYER | (ZnS)80(SiO2)20 | (ZnS)80(SiO2)20 | (ZnS)80(SiO2)20 | (ZnS)80(SiO2)20 |
| JITTER | 11.5% | 9.5% | 8.1% | 7.9% |
| MODULATION | 64% | 56% | 56% | 59% |
| RECORDING POWER | 10.2mW | 12.5mW | 12.6mW | 11.2mW |
| OVERWRITE CYCLE TIMES | 100 TIMES | 2000 TIMES | 150000 TIMES | 200000 TIMES |

FIG. 4

| CHAMBER | LAYER | COMPOSITION OF SPUTTERING TARGETS | POWER SUPPLY | SPUTTERING POWER (kw) | SPUTTERING GAS | SPUTTERING GAS FLOW RATE (sccm) | SPUTTERING RATE (nm/s) | THICKNESS (nm) | SPUTTERING TIME (sec) | COOLING TIME (sec) |
|---|---|---|---|---|---|---|---|---|---|---|
| FIRST CHAMBER | FIRST INTERFERENCE LAYER | (ZnS)80(SiO2)20 | RF | 4.5 | Ar | 25 | 15.5 | 62 | 4.0 | 6.0 |
| SECOND CHAMBER | FIRST INTERFERENCE LAYER | (ZnS)80(SiO2)20 | RF | 4.5 | Ar | 25 | 15.5 | 62 | 4.0 | 6.0 |
| THIRD CHAMBER | FIRST INTERFACE LAYER | Cr2O3 | RF | 4 | Ar | 5 | 1.6 | 3 | 1.9 | 8.1 |
| FOURTH CHAMBER | RECORDING LAYER | Ge28Sb18Te54 | RF | 0.6 | Ar | 5 | 5 | 8 | 1.6 | 8.4 |
| FIFTH CHAMBER | SECOND INTERFACE LAYER | Cr2O3 | RF | 4 | Ar | 5 | 1.6 | 3 | 1.9 | 8.1 |
| SIXTH CHAMBER | SECOND INTERFERENCE LAYER | (ZnS)80(SiO2)20 | RF | 4.5 | Ar | 25 | 15.5 | 30 | 1.9 | 8.1 |
| SEVENTH CHAMBER | ABSORPTION COMPENSATION LAYER | Cr90(Cr2O3)10 | DC | 9.0 | Ar | 15 | 18 | 30 | 1.7 | 8.3 |
| EIGHTH CHAMBER | HEAT SINK LAYER | Al99Ti1 | DC | 9.0 | Ar | 15 | 25 | 50 | 2.0 | 8.0 |

THE COMPOSITIONS OF THE SPUTTERING TARGETS ARE DESCRIBED BY ATOMIC%

FIG. 5

| CHAMBER | LAYER | COMPOSITION OF SPUTTERING TARGETS | POWER SUPPLY | SPUTTERING POWER (kw) | SPUTTERING GAS | SPUTTERING GAS FLOW RATE (sccm) | SPUTTERING RATE (nm/s) | THICKNESS (nm) | SPUTTERING TIME (sec) | COOLING TIME (sec) |
|---|---|---|---|---|---|---|---|---|---|---|
| FIRST CHAMBER | FIRST INTERFERENCE LAYER | (ZnS)80(SiO2)20 | RF | 4.5 | Ar | 25 | 15.5 | 41 | 2.6 | 2.0 |
| SECOND CHAMBER | FIRST INTERFERENCE LAYER | (ZnS)80(SiO2)20 | RF | 4.5 | Ar | 25 | 15.5 | 41 | 2.6 | 2.0 |
| THIRD CHAMBER | FIRST INTERFERENCE LAYER | (ZnS)80(SiO2)20 | RF | 4.5 | Ar | 25 | 15.5 | 41 | 2.6 | 2.0 |
| FOURTH CHAMBER | FIRST INTERFACE LAYER | Cr2O3 | RF | 4 | Ar | 5 | 1.6 | 3 | 1.9 | 2.8 |
| FIFTH CHAMBER | RECORDING LAYER | Ge28Sb18Te54 | RF | 0.6 | Ar | 5 | 5 | 8 | 1.6 | 3.0 |
| SIXTH CHAMBER | PROTECTIVE LAYER | (SnO2)90(ZnS)10 | RF | 4.5 | Ar | 25 | 14.5 | 30 | 2.1 | 2.6 |
| SEVENTH CHAMBER | ABSORPTION COMPENSATION LAYER | Cr90(Cr2O3)10 | DC | 9.0 | Ar | 15 | 18 | 30 | 1.7 | 3.0 |
| EIGHTH CHAMBER | HEAT SINK LAYER | Al99Ti1 | DC | 9.0 | Ar | 15 | 25 | 50 | 2.0 | 2.6 |

THE COMPOSITIONS OF THE SPUTTERING TARGETS ARE DESCRIBED BY ATOMIC%

FIG. 6

| CHAMBER | LAYER | COMPOSITION OF SPUTTERING TARGETS | POWER SUPPLY | SPUTTERING POWER (kw) | SPUTTERING GAS | SPUTTERING GAS FLOW RATE (sccm) | SPUTTERING RATE (nm/s) | THICKNESS (nm) | SPUTTERING TIME (sec) | COOLING TIME (sec) |
|---|---|---|---|---|---|---|---|---|---|---|
| FIRST CHAMBER | THIRD INTERFERENCE LAYER | (SnO2)95(Sb2O3)5 | DC | 9.0 | Ar | 25 | 25 | 76 | 3.0 | 4.2 |
| SECOND CHAMBER | FIRST INTERFERENCE LAYER | (ZnS)80(SiO2)20 | RF | 4.5 | Ar | 25 | 15.5 | 47 | 3.0 | 4.2 |
| THIRD CHAMBER | FIRST INTERFACE LAYER | Cr2O3 | RF | 4 | Ar | 5 | 1.6 | 3 | 1.9 | 5.3 |
| FOURTH CHAMBER | RECORDING LAYER | Ge28Sb18Te54 | RF | 0.6 | Ar | 5 | 5 | 8 | 1.6 | 5.6 |
| FIFTH CHAMBER | SECOND INTERFACE LAYER | Cr2O3 | RF | 4 | Ar | 5 | 1.6 | 3 | 1.9 | 5.3 |
| SIXTH CHAMBER | SECOND INTERFERENCE LAYER | (ZnS)80(SiO2)20 | RF | 4.5 | Ar | 25 | 15.5 | 30 | 1.9 | 5.3 |
| SEVENTH CHAMBER | ABSORPTION COMPENSATION LAYER | Cr90(Cr2O3)10 | DC | 9.0 | Ar | 15 | 18 | 30 | 1.7 | 5.5 |
| EIGHTH CHAMBER | HEAT SINK LAYER | Al99Ti1 | DC | 9.0 | Ar | 15 | 25 | 50 | 2.0 | 5.2 |

THE COMPOSITIONS OF THE SPUTTERING TARGETS ARE DESCRIBED BY ATOMIC%

FIG. 7

| CHAMBER | LAYER | COMPOSITION OF SPUTTERING TARGETS | POWER SUPPLY | SPUTTERING POWER (kw) | SPUTTERING GAS | SPUTTERING GAS FLOW RATE (sccm) | SPUTTERING RATE (nm/s) | THICKNESS (nm) | SPUTTERING TIME (sec) | COOLING TIME (sec) |
|---|---|---|---|---|---|---|---|---|---|---|
| FIRST CHAMBER | THIRD INTERFERENCE LAYER | (SnO2)95(Sb2O3)5 | DC | 9.0 | Ar | 25 | 25 | 47 | 1.9 | 1.5 |
| SECOND CHAMBER | THIRD INTERFERENCE LAYER | (SnO2)95(Sb2O3)5 | DC | 9.0 | Ar | 25 | 25 | 47 | 1.9 | 1.5 |
| THIRD CHAMBER | FIRST INTERFERENCE LAYER | (ZnS)80(SiO2)20 | RF | 4.5 | Ar | 25 | 15.5 | 30 | 1.9 | 1.4 |
| FOURTH CHAMBER | FIRST INTERFACE LAYER | Cr2O3 | RF | 4 | Ar | 5 | 1.6 | 3 | 1.9 | 1.5 |
| FIFTH CHAMBER | RECORDING LAYER | Ge28Sb18Te54 | RF | 0.6 | Ar | 5 | 5 | 8 | 1.6 | 1.8 |
| SIXTH CHAMBER | PROTECTIVE LAYER | (SnO2)90(ZnS)10 | RF | 4.5 | Ar | 25 | 14.5 | 30 | 2.1 | 1.3 |
| SEVENTH CHAMBER | ABSORPTION COMPENSATION LAYER | Cr90(Cr2O3)10 | DC | 9.0 | Ar | 15 | 18 | 30 | 1.7 | 1.7 |
| EIGHTH CHAMBER | HEAT SINK LAYER | Al99Ti1 | DC | 9.0 | Ar | 15 | 25 | 50 | 2.0 | 1.4 |

THE COMPOSITIONS OF THE SPUTTERING TARGETS ARE DESCRIBED BY ATOMIC%

- 8 HEAT SINK LAYER
- 7 ABSORPTION COMPENSATION LAYER
- 6 SECOND INTERFERENCE LAYER
- 5 SECOND INTERFACE LAYER
- 4 RECORDING LAYER
- 3 FIRST INTERFACE LAYER
- 2 FIRST INTERFERENCE LAYER
- 1 SUBSTRATE

- 8 HEAT SINK LAYER
- 7 ABSORPTION COMPENSATION LAYER
- 13 PROTECTIVE LAYER
- 4 RECORDING LAYER
- 12 INTERFACE LAYER
- 10 INTERFERENCE LAYER
- 1 SUBSTRATE

INFORMATION RECORDING MEDIA, MANUFACTURING TECHNIQUE AND INFORMATION RECORDING METHOD

FIELD OF THE INVENTION

The present invention relates to an information recording medium recording information by irradiation of an energy beam, a method for manufacturing said medium, and methods for recording and regeneration thereof, and particularly to phase-change optical disks such as DVD-RAM, DVD-RW, etc., a method for manufacturing such optical disks, and methods for recording and regeneration thereof.

BACKGROUND OF THE INVENTION

In the recent years, the market of optical disks exclusively used for regeneration such as DVD-ROM, DVD-Video, etc. is expanding. Furthermore, overwriting type DVD such as 4.7 GB DVD-RAM, 4.7 GB DVD-RW, etc. are put into market, and the market thereof is rapidly expanding as image-recording media capable of replacing the back-up media for computer, or VTR.

The hitherto known DVD-RAM has a 7-layered structure, as described in, for example, Proceedings of SPIE—The international Society for Optical Engineering, Volume 3401, pp. 24–32, 1998. That is to say, it has a 7-layered structure comprising a successive lamination of substrate 1, first interference layer 2, first interface layer 3, recording layer 4, second interface layer 5, second interference layer 6, absorption compensation layer 7 and heart sink layer (Al alloy) 8, as shown in FIG. 10. In this structure, a $ZnS—SiO_2$ type material is used as the first and second interference layers; a Ge—N or $Cr_2O_3$ type material higher in melting point and chemical stability than the $ZnS—SiO_2$ type materials is used as the first and second interface layers; and $Ge_2Sb_2Te_5$ or the like is used as the recording layer 4.

A number of researches have been conducted so far for the purpose of discovering a thermally and optically excellent interference layer material. For example, in JP-A-63-103453 is disclosed an optical information recording member having an interference layer comprising at least one material selected from ZnS and ZnSe and at least one material selected from $SiO_2$, $GeO_2$, $SnO_2$, $TeO_2$, $ZrO_2$, $Al_2O_3$, $Y_2O_3$ and $Ta_2O_5$. It is mentioned in this patent gazette that the laser power necessary for crystallization can be lessened by incorporating 10–30 mol % of $SiO_2$ into the interference layer.

In JP-A-10-275361 is disclosed an optical information recording member having an interference layer comprising at least one material selected from ZnS and ZnSe and at least one material selected from $SiO_2$, $GeO_2$, $SnO_2$, $TeO_2$, $ZrO_2$, $Al_2O_3$, $Y_2O_3$ and $Ta_2O_5$. It is mentioned in that patent gazette that, when the metallic elements constituting the above-mentioned oxides present in the interference layer occupy 30–65 atomic % based on the sum of Zn and the oxides-constituting metallic elements which is taken as 100 atomic %, the laser powder necessary for crystallization is small and there can be obtained an optical information recording member excellent in repeated overwrite characteristics, modulation and flexibility in the optical design.

Furthermore, in JP-A-10-302308 is described a protective layer contacted with the recording layer, which is obtained by adding an oxide such as $SiO_2$, $GeO_2$, $SnO_2$, $In_2O_3$ or the like or a nitride such as $Si_3N_4$ or the like to a crystalline metal-chalcogen compound such as ZnS, ZnSe, ZnTe, PbS, PbTe or the like.

SUMMARY OF THE INVENTION

The protective layer materials disclosed in the above-mentioned prior art are very good. However, if these protective layer materials are disposed in contact with a high-melting recording film used in DVD-RAM, there arises a problem that the atoms in the interference layer are translocated by dissolution into the recording layer while repeating the recording of information several hundreds times, as a result of which the reflectivity decreases to a great extent, and it becomes impossible to repeat the overwriting many times.

The object of the present invention consists in making it possible to repeat the overwriting many times.

After extensive studies, the present inventors have found that, when a material containing Sn in a prescribed proportion is used as a layer contacted with a recording layer, the heat conductivity is as low as that of $ZnS—SiO_2$, the sputtering rate is high, the product is optically transparent and thermally stable and, even when a phase-change material of which melting point becomes 630° C. or above is used as the recording material, a good thermal stability is exhibited. Concretely speaking, the problem mentioned above can be solved by using an information recording medium described below.

Thus, the object mentioned above can be achieved by using, as a layer contacted with the recording layer, (1) a first layer containing a transition metal element, oxygen and tin, wherein a content of tin is not smaller than 23.3 atomic % but not exceeding 32.3 atomic %, or (2) a first layer containing a transition metal element, sulfur, oxygen and tin, wherein a content of tin is not smaller than 23.3 atomic % but not exceeding 32.3 atomic %, or (3) a first layer containing zinc, sulfur, oxygen and tin, wherein a content of tin is not smaller than 23.3 atomic % but not exceeding 32.3 atomic %. It should be noted here that, when the content of tin is in the range of from 23.3 to 32.3 atomic %, a content of $SnO_2$ in a layer contacted with the recording layer comes to 70–97 mol %.

Other objects, features and advantages of the invention will become apparent from the following description of the embodiments of the invention taken in conjunction with the accompanying drawings.

BRIEF DESCRIPTION OF THE DRAWINGS

FIG. 1 is a drawing illustrating a relation between a prior medium structure and performance thereof.

FIG. 2 is a drawing illustrating a relation on performance between a prior medium structure and the medium structure of the present invention.

FIG. 4 is a drawing illustrating a manufacturing example of a prior information recording medium.

FIG. 5 is a drawing illustrating a manufacturing example of the information recording medium of the present invention.

FIG. 6 is a drawing illustrating another manufacturing example of the information recording medium of the present invention.

FIG. 7 is a drawing illustrating yet another manufacturing example of the information recording medium of the present invention.

ILLUSTRATION OF THE MARKS 8-1: Optical disk;
8-2: Motor;
8-3: Optical head;
8-4: Pre-amplitude circuit;
8-6: Recording pulse generator;
8-7: Laser driver;
8-8: 8–16 Encoder;
8-9: L/G servo circuit;
8-10: 8–16 Decoder.

DETAILED DESCRIPTION OF THE INVENTION

Figure 3:
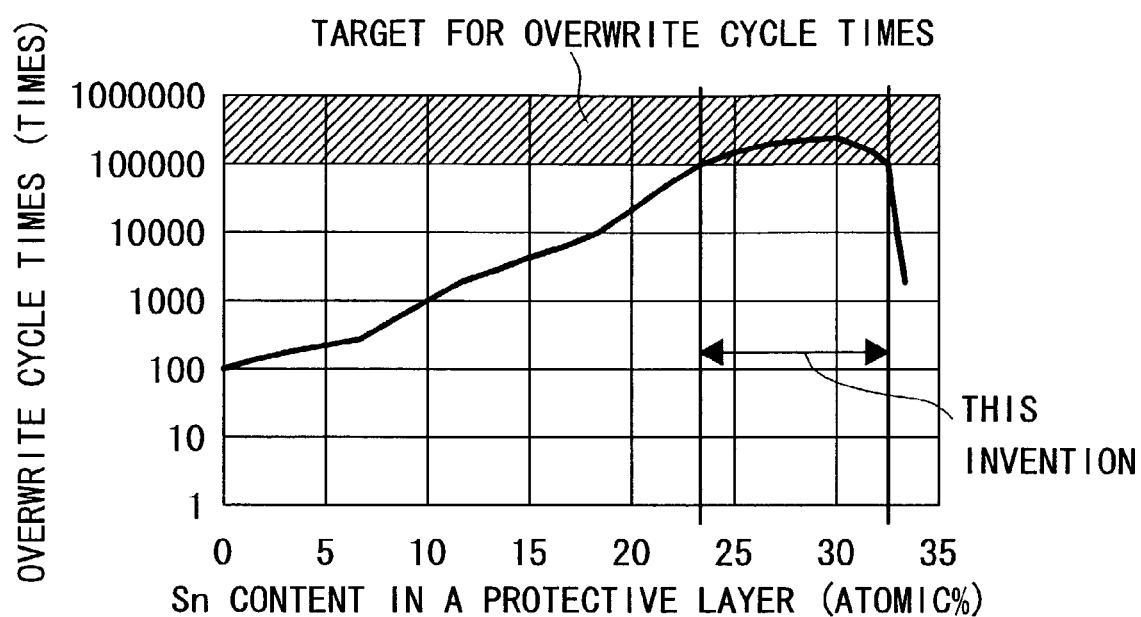
FIG. 3 is a drawing illustrating an example of the present invention.
Figure 11:
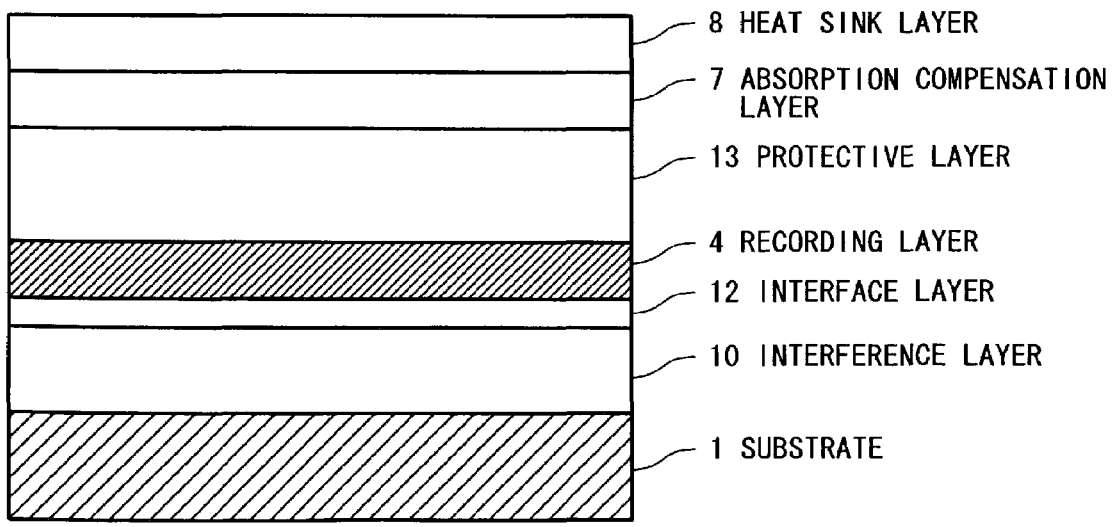
FIG. 11 is a drawing illustrating the medium of an example of the present invention.

By use of such a "layer contacted with recording layer" (a first layer) which is made of the above-mentioned material, the deterioration of regenerating signal can be suppressed so as to remain on a practical level even if the recording of information is repeated so many times as 100,000 times. Herein, the inventors investigated the relation between the tin content in the layer contacted with recording film and the overwrite cycle times. The results obtained are shown in FIG. 3. In this investigation, a medium was so constructed as shown in FIG. 11, namely in such a manner that an interference layer 10, an interface layer 12, a recording layer 4, a protective layer 13, an absorption compensation layer 7 and heat sink layer 8 were provided on substrate 1, and the material constituting the protective layer 13 was made of $SnO_2$—ZnS, and the investigation was carried out while varying the content of Sn. As is apparent from FIG. 3, the overtime cycle times reaches a maximum value when the tin content in the protective layer is about 30 atomic %, and exceeds 100,000 times (the target for overwrite cycle times) when the tin content in the protective layer is in the range of from 23.3 atomic % to 32.3 atomic %. In this specification, the term "protective layer" is used only when a single layer has the function of interference layer and the function of interface layer preventing the diffusion of interference layer material into recording layer simultaneously, to name such a single layer.

It has become apparent from FIG. 3 that the overwrite cycle times can be improved overwhelmingly by adding $SiO_2$ to the protective layer of FIG. 11. However, an effect of improving the overwrite cycle times can be obtained by using, as the layer contacted with the recording layer, either (1) a first layer containing a transition metal, oxygen and tin, wherein the content of tin is not smaller than 23.3 atomic % and not exceeding 32.3 atomic %, or (2) a first layer containing a transition metal, sulfur, oxygen and tin, wherein the content of tin is not smaller than 23.3 atomic % and not exceeding 32.3 atomic %, or (3) a first layer containing zinc, sulfur, oxygen and tin, wherein the content of tin is not smaller than 23.3 atomic % and not exceeding 32.3 atomic %. That is to say, an effect of improving the overwrite cycle times can be obtained by using a layer made of either one of (1) to (3) as a layer contacted with the light-incidence side of the recording layer or as a layer contacted with the opposite side of the light-incidence side of recording layer. A maximum deterioration-suppressing effect can be obtained when the above-mentioned material is used in both the layers contacted with both sides of recording layer, namely both the layer of light-incidence side and the layer of the opposite side.

It is considered that this is because of the following mechanism. In the following description, a case that the layer contacted with recording layer is made of a $SnO_2$—ZnS type material is used as a typical example. That is, when $SnO_2$ is used as the protective layer, the low-melting metal Sn (mp. 232° C.) is liberated from the $SnO_2$ and melts and dissolves into the recording layer, which can deteriorate the performance of recording layer. Similarly, when ZnS is used as the protective layer, the low-melting S (mp. 113° C.) is liberated from the ZnS and melts and dissolves into the recording layer, which deteriorates the performance of recording layer. However, when $SnO_2$ and ZnS are used in combination, Sn and S are liberated and recombined to form high-melting SnS or $SnS_2$. Although $SnO_2$—ZnS type material of (3) has been used in the description given above, the principle is the same as above even in the case of using a (1) type material. In the description given below, a case of CrO—SnO material is mentioned as a typical example of material (1) containing a transition metal, oxygen and tin. In this case, the transition metal Cr can take a plurality of valency numbers such as 3, 4 and 6. Although Cr is in the state of highest stability when its valency is 3, the chromium atoms in CrO have not only a valency of 3 but ionic forms of 4- and 6-valencies are contaminated usually. The 4- and 6-valent Cr have a tendency of readily breaking their linkage to oxygen. In other words, the oxygen in CrO is partially in an active state. Through reaction of the active oxygen with free Sn in SnO, the free Sn can be fixed and the dissolution of free Sn into recording film can be prevented. On the other hand, in the case of material (2) containing a transition metal, sulfur, oxygen and tin, too, the same principle as above holds. As a typical example of (2), a TaS—SnO type material can be referred to, where the same principle as in CrO works so that the active S in TaS fixes the free Sn in SnO, whereby SnS of relatively high melting point is formed, by which the dissolution of free Sn into recording film can be prevented.

As typical examples of the layer contacted with recording layer, materials of $Cr_2O_3$—$SnO_2$ type and $SnO_2$—ZnS type have been mentioned above. Among them, $SnO_2$—ZnS type exhibits an effect of enduring a greatest times of overwriting most explicitly.

JP-A-63-103453 and JP-A-10-302308 mentioned as prior arts above make no concrete mention of the amount of Sn added. JP-A-10-275361 illustrates the protective layer in its column 0012 by saying that this is a layer constituted of at least one material selected from ZnS and ZnSe and at least one material selected from $SiO_2$, $GeO_2$, $SnO_2$, $TeO_2$, $ZrO_2$, $Al_2O_3$, $Y_2O_3$ and $Ta_2O_5$ and the proportion of the oxide-forming elements is 35–65 atomic % based on the sum of the Zn and the oxide-forming elements constituting the protective layer which is taken as 100 atomic %. When the oxide-forming element is $SnO_2$, the Sn content is ⅓ of the above-mentioned numerical value, or 11.7–21.7 atomic %. Since this value is smaller than the content in the present patent, this prior art cannot achieve such great overwrite cycle times as in the present invention.

The material (2) further contains, in the recording layer, germanium, antimony and tellurium in addition to the above-mentioned (1), and a good result is obtained when the content of germanium is 25 atomic % or above and the content of antimony is 20 atomic % or less. Such a constitution gives a high melting point to the recording layer material, as a result of which a signal having a great amplitude of regeneration signal is obtained. This is due to the following mechanism.

Thus, in a phase changing recording, the recording is carried out fundamentally by making the informations of [0] and [1] correspond to crystalline and amorphous, respectively. Since crystalline state and amorphous state are different in refractive index, refractive index and film thickness of the layers are so designed as to maximize the reflectivity difference between the region changed into crystalline state and the region changed into amorphous state. By projecting a laser beam to the crystallized region and the amorphous region and regenerating the reflected light, the recorded [0] and [1] can be detected. Further, when the change in refractive index between the crystalline and amorphous states of a recording layer material is great, the change in reflectivity between crystalline and amorphous states is also great, so that the amplitude of regenerating signal can be made great.

Further, for making a prescribed site amorphous, a laser beam of relatively high power is irradiated to heat the recording layer so that its temperature exceeds melting point of the recording layer material. On the other hand, for making a prescribed site crystalline, a laser beam of relatively low power is projected to heat the recording layer so that its temperature reaches neighborhood of crystallization temperature not exceeding melting point. By taking such a measure, an amorphous state and a crystalline state can be changed reversibly. Accordingly, the maximum achievable temperature in the neighborhood of recording layer becomes proportional to melting point of the recording film.

As referential examples, melting points of typical phase-change recording materials are shown below.

$Ge_{50}Te_{50}$: 710° C.
$Ge_{38.1}Sb_{9.5}Te_{52.4}$: 680° C.
$Ge_{33.3}Sb_{13.3}Te_{53.4}$: 660° C.
$Ge_{25}Sb_{20}Te_{55}$: 630° C.
$Ge_{22.2}Sb_{22.2}Te_{55.6}$: 620° C.
$Sb_{40}Te_{60}$: 620° C.
$Sb_{70}Te_{30}$: 540° C.

As above, $Ge_{50}Te_{50}$ is highest in melting point among the phase-change recording layer materials known up to date. Further, this material is advantageous in that the difference in refractive index between crystalline state and amorphous state is very great. $Sb_{40}Te_{60}$ is characterized in that its melting point is low and it requires only a small quantity of heat added to protective layer at the time of information recording. However, it has a problem that the difference in refractive index between crystalline and amorphous states is small. Materials having mixed compositions of these two compounds such as $Ge_{22.2}Sb_{22.2}Te_{55.6}$, $Ge_{25}Sb_{20}Te_{55}$, $Ge_{33.3}Sb_{13.3}Te_{53.4}$, $Ge_{38.1}Sb_{9.5}Te_{52.4}$, etc. lie midway between $Ge_{50}Te_{50}$ and $Sb_{40}Te_{60}$ in properties, while a material having a higher content of $Ge_{50}Te_{50}$ is greater in the refractive index change and higher in melting point.

In 4.7 GB DVD-RAM, compositions close to from $Ge_{25}Sb_{20}Te_{55}$ to $Ge_{38.1}Sb_{9.5}Te_{52.4}$ are used in order to obtain a great refractive index change. As its result, melting point of recording layer material is as high as about 630–680° C., and the temperature at regions close to recording layer is also high, so that the problem of diffusion of interference layer material into recording layer is apt to arise. Therefore, an interface layer has been necessary between recording layer and interference layer in the prior art.

Figure 12:
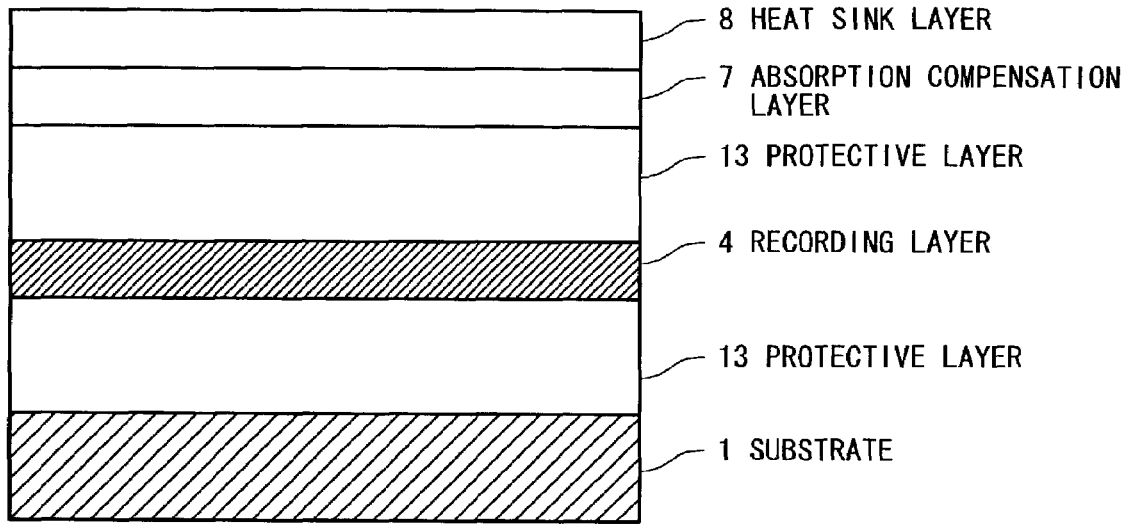
FIG. 12 is a drawing illustrating the medium of another example of the present invention.
Figure 13:
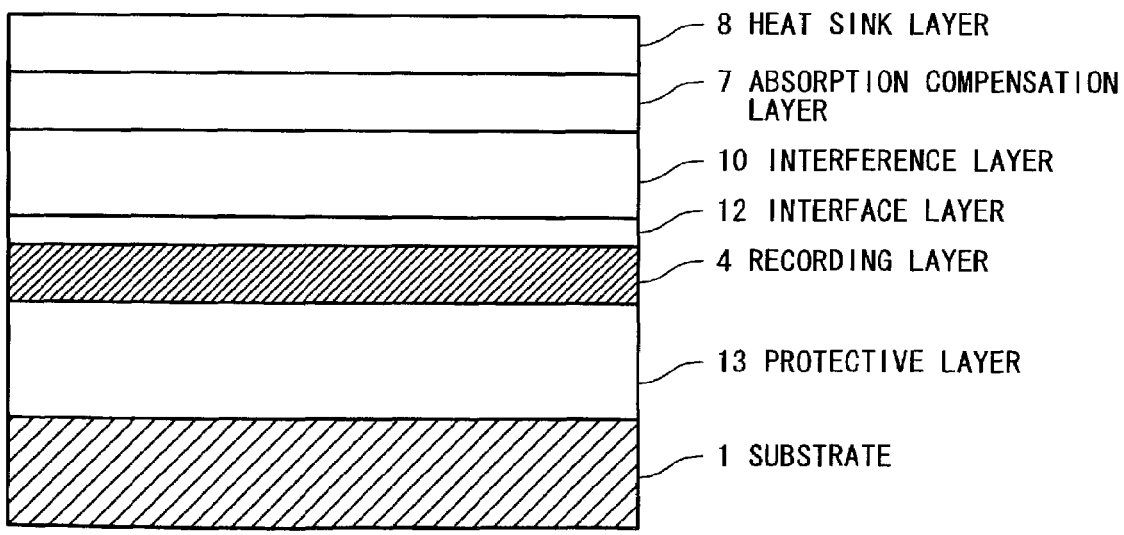
FIG. 13 is a drawing illustrating the medium of further another example of the present invention.

(3) The two layers (interference layer and interface layer) in the prior art are replaced with one protective layer made of the material mentioned in (1). Accordingly, the constitution may be any of FIG. 11 to FIG. 13. That is, any of a case of making both upside layer and downside layer of the recording layer into protective layers, and a case of making any one of upside layer and downside layer of recording layer into a protective layer may be adopted. Concretely, as shown in FIG. 11, it is constituted of substrate 1/interference layer 10/interface layer 12/recording layer 4/protective layer 13/absorption compensation layer 7/heat sink layer 8; or as shown in FIG. 12, it is constituted of substrate 1/protective layer 13/recording layer 14/protective layer 13/absorption compensation layer 7/heat sink layer 8; or as shown in FIG. 13, it is constituted of substrate 1/protective layer 13, recording layer 4/interface layer 12/interference layer 10/absorption compensation layer 7/heat sink layer 8. By using the material mentioned in (1) as above, the protective layer material becomes not readily diffusing into the recording layer even if a high-melting phase-change recording material having a high melting point of 630° C. or above is used, which sometimes makes it unnecessary to use the interface layer. When no interface layer is used, the number of layers can be decreased, which facilitates the manufacture of medium.

(4) The effect of the present invention can be exhibited by providing groove-like concavity and convexity on the substrate and recording tracks for recording information on both of the concavity (groove) and the convexity (land).

In the land-groove type, depth of the groove is set to from about $\lambda/7$ to about $\lambda/5$ ($\lambda$ is wavelength of laser) for the purpose of cross talk cancel. Under such a condition, the laser beam is diffracted by the grooves and the reflected light decreases to about 70%, as a result of which amplitude of regenerated signal also decreases to about 70%. Thus, melting point of recording layer material has to be enhanced in order to obtain a high amplitude of signal.

However, by using the "layer contacted with recording film" mentioned in (1), a high signal amplitude becomes obtainable in the land-groove type medium even if a high-melting phase change-recording material exhibiting a high melting point of 630° C. or above is used, and high overwrite cycle times can be achieved.

(5) This is a structure using the "layer contacted with recording layer" mentioned in (1), wherein upside and downside layers both contain Sn. This structure has a further effect of prolonging shelf life of medium. Details of this structure are mentioned below. For simplicity, information was recorded on the information recording medium having the structure of FIG. 11, and shelf life of the recorded information was estimated by an accelerated test. Through this study, the inventors found that, when Sn was incorporated into the interface layer or protective layer contacted with recording layer, the shelf life was prolonged in proportion to the amount of Sn, though the reason for this phenomenon is unknown. When no Sn was added to the interface layer contacted with recording layer, the shelf life was estimated as about one year by an accelerated test. When Sn was added (for example, in an amount of 30 atomic %), the estimated shelf life was about 5 years. In this experiment, Sn was added to the interface layer of light-incidence side of recording layer. In another experiment where Sn (30 atomic %) was added to the protective layer of the opposite side to the light-incidence side of recording layer, the estimated shelf life was still about 5 years. When Sn was added to both of the interface layer and protective layer (both 30 atomic %), the shelf life became longer additionally, so that the estimated shelf life was 10 years or longer. When the amount of Sn added to both of the interface and protective layers was lowered to 10 atomic %, the estimated shelf life was about 5 years. It was found that the greatest effect of prolonging the shelf life was obtained by adding Sn to both of the layer residing in the light-incidence side of recording layer (interface layer) and the layer residing in the opposite side to the light-incidence side of recording layer (protective layer), and a better result was obtained by adding a greater amount of Sn unless it exceeded the scope of the present invention.

(6) The object mentioned above can be achieved by a method for manufacturing the above-mentioned media (1) to (5) or by a method for carrying out recording or regeneration by the use of the above-mentioned media (1) to (5).

In the present invention the above-mentioned information recording medium is sometimes expressed as phase-change optical disk or simply as optical disk. Since the present invention is applicable to any information recording media, so far as it is an information recording medium in which heat is generated by irradiation of energy beam and a change in the arrangement of atoms is caused by the heat and information is recorded by the change. The invention is applicable to information recording media other than disk-form information recording media such as optical card and the like, too, regardless of the shape of information recording medium.

In this specification, the above-mentioned energy beam is sometimes referred to as laser beam or simply as laser light or as light. Since the present invention can exhibit its effect so far as the energy beam can generate heat on the information recording medium, as has been mentioned above, the effect of the present invention is not lost even if energy beams such as electron beam or the like are used. Although the present invention was invented for information recording media for red-colored laser having a wavelength of 645–660 nm, the invention exhibits its effect on information recording media carrying out recording by a laser of relatively short wavelength such as blue-colored laser, ultraviolet laser, and the like, too.

Although the present invention is based on a premise that a substrate is disposed in the light-incidence side of a recording layer, the effect of the present invention is not lost even in cases where a substrate is disposed in the opposite side to the light-incidence side of recording layer and a protective material having a smaller thickness than that of substrate such as a protective sheet or the like is disposed in the light-incidence side.

EXAMPLES

In FIGS. 1 and 2 are shown comparative examples and examples for the purpose of comparing information recording media of prior art with those of the present invention. In the measurement of performances of the information recording media shown in the examples, an information recording apparatus (FIG. 8) described later was use to measure jitter (after ten overwrite cycles), modulation, recording power and overwrite cycle times. Meanwhile, land-groove recording was adopted for this information recording media. For this reason, jitter, modulation, recording power, average overwrite cycle times, when recording information in land and groove, are shown here. Targets of the performance were as follows:

Jitter: 9% or less
Modulation: 40% or above
Recording power: 13 mW or under
Overwrite cycle times: 100,000 times or above.

Comparative Example 1

The laminate structure of Comparative Example 1 is mentioned below. On a substrate provided in the light-incidence side of recording layer, 124 nm of $(ZnS)_{80}(SiO_2)_{20}$ as a first interference layer, 3 nm of $Cr_2O_3$ as a first interface layer, 8 nm of $Ge_{28}Sb_{18}Te_{54}$ as a recording layer, 3 nm of $Cr_2O_3$ as a second interface layer, 30 nm of $(ZnS)_{80}(SiO_2)_{20}$ as a second interference layer, 33 nm of $Cr_{90}(Cr_2O_3)_{10}$ as an absorption compensation layer and 50 nm of $Al_{99}Ti_1$ as a heat sink layer are successively provided by sputtering. Thereon is provided an ultraviolet-curable resin. Two sheets of information recording medium prepared in the above-mentioned manner are bonded together by the use of an adhesive, so that their ultraviolet-curable resin sides face each other. Then, the whole area is initialized with an apparatus for initializing (crystallizing) the recording layer.

Performances of the information recording medium thus prepared are shown in FIG. 1. The values of jitter, modulation, recording power and overwrite cycle times are all good. As above, a good information recording medium is obtained by providing a first interface layer and a second interface layer are provided on both sides of a recording layer, even when a phase-change recording layer material giving a melting point of recording film as high as 630° C. or above is used. Comparative Example 1 has, however, a problem that the number of laminated layers is as large as 7, so that no sufficient productivity can be ensured when a sputtering apparatus of low price, as shown in <Production Example 1 of Information Recording Media>, is used.

Comparative Example 2

Lamination structure of Comparative Example 2 is as follows. On a substrate disposed on the light-incidence side of recording layer, 124 nm of $(ZnS)_{80}(siO_2)_{20}$ as a first interference layer, 3 nm of $Ge_3N_4$ as a first interface layer, 8 nm of $Ge_{28}Sb_{18}Te_5$ as a recording layer 4, 3 nm of $Ge_3N_4$ as a second interface layer, 30 nm of $(ZnS)_{80}(SiO_2)_{20}$ as a second interference layer, 25 nm of $Ge_{80}Cr_{20}$ as an absorption compensation layer and 50 nm of $Al_{99}Ti_1$ as a heat sink layer are successively laminated by sputtering, and thereon is provided an ultraviolet-curable resin. Two sheets of the information recording medium thus prepare are bonded together by the use of an adhesive so that their ultraviolet-curable resin sides face each together, after which the whole area is initialized with an apparatus for initializing (crystallizing) the recording layer.

FIG. 1 illustrates the performances of the information recording medium prepared in the above-mentioned manner. Jitter, modulation, recording power and overwrite cycle times all give good values. As above, a good information recording medium can be obtained by providing a first interface layer and a second interface layer on both sides of a recording layer, even in a case of using a phase-change recording layer material giving a recording film having as high a melting point as 630° C. or above, too. Similarly to Comparative Example 1, the problem of Comparative Example 2 is that, since the number of lamination is as large as 7, no sufficient productivity can be ensured when a sputtering apparatus of low price is used.

Comparative Example 3

The lamination structure of Comparative Example 3 is as mentioned below. Thus, on a substrate provided on the light-incidence side of a recording layer, 124 nm of $(ZnS)_{80}(SiO_2)_{20}$ as a first interference layer, 3 nm of $Cr_2O_3$ as a first interface layer, 8 nm of $Ge_{28}Sb_{18}Te_{54}$ as a recording layer, 33 nm of $(ZnS)_{80}(SiO_2)_{20}$ as a second interference layer, 33 nm of $Cr_{90}(Cr_2O_3)_{10}$ as an absorption compensation layer, and 50 nm of $Al_{99}Ti_1$ as a heat sink layer are successively laminated by sputtering, and thereon is provided an ultraviolet-curable resin. Two sheets of the information recording medium prepared in the above-mentioned manner are bonded together by the use of an adhesive, so that the respective ultraviolet-curable resin sides face each other, and then the whole area is initialized with an apparatus for initializing (crystallizing) the recording layer.

FIG. 1 illustrates the performance of the information recording medium prepared in the above-mentioned manner. Although modulation and recording power are good, jitter and overwrite cycle times are both unable to reach the targets. This is for the reason that a phase-change material giving a recording film having a melting point of 630° C. or above is used. That is, even if a first interface layer is provided, S in the second interference layer is diffused and dissolved into the recording layer while repeating the recording of information many times, which gradually lowers the crystallization velocity of recording layer and at the same time causes a drop in reflectivity and a decrease in signal amplitude, and as its result jitter and overwrite cycle times are deteriorated.

Comparative Example 4

The lamination structure of Comparative Example 4 is as mentioned below. Thus, on a substrate provided on the light-incidence side of recording layer, 124 nm of $(ZnS)_{80}(SiO_2)_{20}$ as a first interference layer, 3 nm of $Cr_2O_3$ as a first interface layer, 8 nm of $Ge_{28}Sb_{18}Te_{54}$ as a recording layer, 33 nm of $Cr_2O_3$ as a second interface layer, 33 nm of $Cr_{90}(Cr_2O_3)_{10}$ as an absorption compensation layer and 50 nm of $Al_{99}Ti_1$ as a heat sink layer are successively laminated by sputtering, and thereon is provided an ultraviolet-curable resin. Two sheets of the information recording medium thus prepared are bonded together with an adhesive so that the ultraviolet-curable resin sides face each other, and then the whole area is initialized with an apparatus for initializing (crystallizing) recording layer.

FIG. 1 illustrates the performance of the information recording medium prepared in the above-mentioned manner. None of jitter, modulation, recording power and overwrite cycle times reach the targets. This is for the reason that the $Cr_2O_3$ used in the second interface layer has two problems. One of them is an excessively high heat conductivity and the other is an excessively high light absorption. If heat conductivity is too high, the temperature of recording layer cannot rise sufficiently at the usual recording power, so that the recording power has to be elevated. If light absorption is too large, the optical interfering effect between recording layer and absorption compensation layer cannot be utilized sufficiently, which causes a decrease in modulation and as its result a rise in jitter and a decrease in overwrite cycle times are caused. Further, Comparative Example 4 involves another problem with regard to productivity. That is, the high-melting oxides and nitrides used in the interface layer usually have a lower sputtering rate (about 1/a few) as compared with the ZnS—$SiO_2$ type materials used in the interference layer, and for making an optimum design, film thickness of second interface layer has to be increased to about ten times of usual thickness and therefore the period of time necessary for sputtering becomes very long.

Comparative Example 5

The laminate structure of Comparative Example 5 is as mentioned below. Thus, on a substrate disposed on the light-incidence side of recording layer, 124 nm of $(ZnS)_{80}(SiO_2)_{20}$ as a first interference layer, 3 nm of $Cr_2O_3$ as a first interface layer, 8 nm of $Ge_{28}Sb_{18}Te_{54}$ as a recording layer, 29 nm of ZnS as a protective layer, 33 nm of $Cr_{90}(Cr_2O_3)_{10}$ as an absorption compensation layer and 50 nm of $Al_{99}Ti_1$ as a heat sink layer are successively laminated by sputtering, and thereon is provided an ultraviolet-curable resin. Two sheets of the information-recording medium thus prepared are bonded together by the use of an adhesive, so that the ultraviolet-curable resins face each other, and then whole area of the recording layer is initialized with an apparatus for initializing (crystallizing) the crystalline layer.

FIG. 2 illustrates the performance of the information recording medium prepared in the above-mentioned manner. Although modulation and recording power are good, jitter and overwrite cycle times are both unable to reach the targets. This is for the reason that a phase-change material giving a recording film having a melting point of 630° C. or above is used. That is, even if a first interface layer is provided, S in the second interference layer is diffused and dissolved into the recording layer while repeating the recording of information many times, which gradually lowers the crystallization velocity of recording layer and at the same time causes a drop in reflectivity and a decrease in signal amplitude, and as its result deteriorates jitter and overwrite cycle times.

Comparative Example 6

The laminate structure of Comparative Example 6 is as shown below. On a substrate disposed on the light-incidence side of a recording layer, 124 nm of $(ZnS)_{80}(SiO_2)_{20}$ as a first interference layer, 3 nm of $Cr_2O_3$ as a first interface layer, 8 nm of $Ge_{28}Sb_{18}Te_{54}$ as a recording layer, 33 nm of $SnO_2$ as a protective layer, 33 nm of $Cr_{90}(Cr_2O_3)_{10}$ as an absorption compensation layer and 50 nm of $Al_{99}Ti_1$ as a heat sink layer are successively laminated by sputtering, and thereon is provided an ultraviolet-curable resin. Two sheets of the information-recording medium prepared in the above-mentioned manner are bonded together by the use of an adhesive, so that the ultraviolet-curable resin sides face each other, and the whole area is initialized with an apparatus for initializing (crystallizing) the recording layer.

FIG. 2 illustrates the performance of the information-recording medium prepared above. Although modulation and recording power are good, jitter and overwrite cycle times are both unable to reach the targets. This is for the reason that a phase-change recording material giving a recording film having a melting point of 630° C. or above is used. That is, even if a first interface layer is provided, Sn in the protective layer is diffused and dissolved into the recording layer while repeating the recording of information many times, which gradually lowers the crystallization velocity of recording layer and at the same time causes a decrease in signal amplitude, and as its result deteriorates jitter and overwrite cycle times.

Example 1

Figure 14:
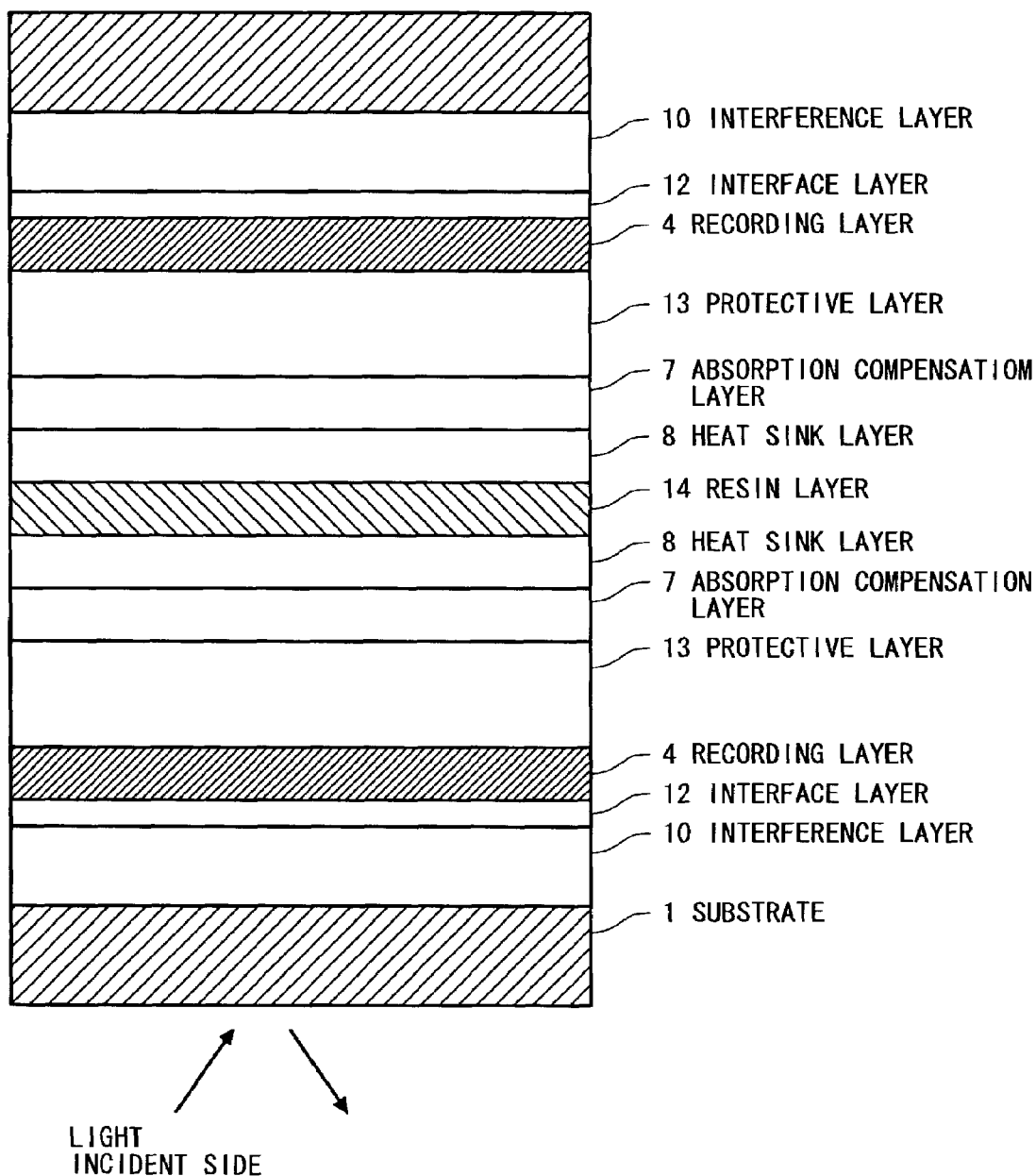
FIG. 14 is a drawing illustrating the medium of yet another example of the present invention.

FIG. 14 illustrates the laminate structure of Example 1. On substrate 1 disposed on the light-incidence side of a recording layer, 124 nm of $(ZnS)_{80}(SiO_2)_{20}$ as a first interference layer 10, 3 nm of $Cr_2O_3$ as a first interface layer 12, 8 nm of $Ge_{28}Sb_{18}Te_{54}$ as a recording layer 4, 32 nm of $(SnO_2)_{90}(Cr_2O_3)_{10}$ as a protective layer 13, 33 nm of $Cr_{90}(Cr_2O_3)_{10}$ as an absorption compensation layer 7, and 50 nm of $Al_{99}Ti_1$ as a heat sink layer 8 are successively laminated by sputtering, and thereon is provided ultraviolet-curable resin 14. Two sheets of the information-recording medium prepared in the above-mentioned manner are bonded together by the use of an adhesive so that the ultraviolet-curable resin sides face each other, and then the whole area is initialized with an apparatus for initializing (crystallizing) the recording layer.

FIG. 2 illustrates the performance of the information recording medium prepared in the above-mentioned manner. Jitter, modulation, recording power and overwrite cycle times all show good values. As above, even if a phase-change recording layer material giving a recording film having a melting point of 630° C. or above is used, a good information recording medium is obtained so far as a first interface layer and a protective layer of the present invention are provided on both sides of a recording layer. Although Comparative Examples 1 and 2 also gave a similarly good result, Comparative Examples 1 and 2 had a problem that the number of lamination by sputtering was as large as 7, and therefore no sufficient productivity could be ensured so long as a sputtering apparatus of low price as shown in <Production Example 1 of Information Recording Medium> was used. Contrariwise, in Example 1, the number of lamination by sputtering is so low as 6, due to which the efficiency of production is greatly improved.

Example 2

FIG. 14 illustrates the laminate structure of Example 2. On substrate 1 disposed on the light-incidence side of a recording layer, 124 nm of $(ZnS)_{80}(SiO_2)_{20}$ as a first interference layer 10, 3 nm of $Cr_2O_3$ as a first interface layer 12, 8 nm of $Ge_{28}Sb_{18}Te_{54}$ as a recording layer 4, 32 nm of $(SnO_2)_{80}(ZnS)_{20}$ as a protective layer 13, 33 nm of $Cr_{90}(Cr_2O_3)_{10}$ as an absorption compensation layer 7, and 50 nm of $Al_{99}Ti_1$ as a heat sink layer 8 are successively laminated by sputtering, and thereon is provided ultraviolet-curable resin 14. Two sheets of the information-recording medium prepared in the above-mentioned manner are bonded together by the use of an adhesive so that the ultraviolet-curable resin sides face each other, and then the whole area is initialized with an apparatus for initializing (crystallizing) the recording layer.

FIG. 2 illustrates the performance of the information recording medium prepared in the above-mentioned manner. Jitter, modulation, recording power and overwrite cycle times all show good values. As above, even if a phase-change recording layer material giving a recording film having a melting point of 630° C. or above is used, a good information recording medium is obtained so far as a first interface layer and a protective layer of the present invention are provided on both sides of a recording layer. Although Comparative Examples 1 and 2 also gave a similarly good result, Comparative Examples 1 and 2 had a problem that the number of lamination by sputtering was as large as 7, and therefore no sufficient productivity could be ensured so long as a sputtering apparatus of low price as shown in <Production Example 1 of Information Recording Medium> was used. Contrariwise, in Example 1, the number of lamination by sputtering is so small as 6, due to which the efficiency of production is greatly improved as shown in <Method for Producing Information Recording Medium 2>. Although in Example 1, the recording power was 12.6 mW and the target was reached, the value was somewhat high. In Example 2, contrariwise, the values of jitter, modulation, recording power and overwrite cycle times are all better than those in Example 1.

From the Examples presented above, it has become apparent that good performance can be obtained when sulfide or transition metal is added to the tin oxide in the protective layer.

Example 3

(Sputtering Apparatus)

As the sputtering apparatus for manufacturing the information recording media of the present invention, a sputtering apparatus having a plurality of chambers in which each chamber is provided with one sputtering target and the substrate for information recording media are successively transported between the chambers, or the so-called "single-disk-process sputtering apparatus", is suitable for use.

Figure 9:
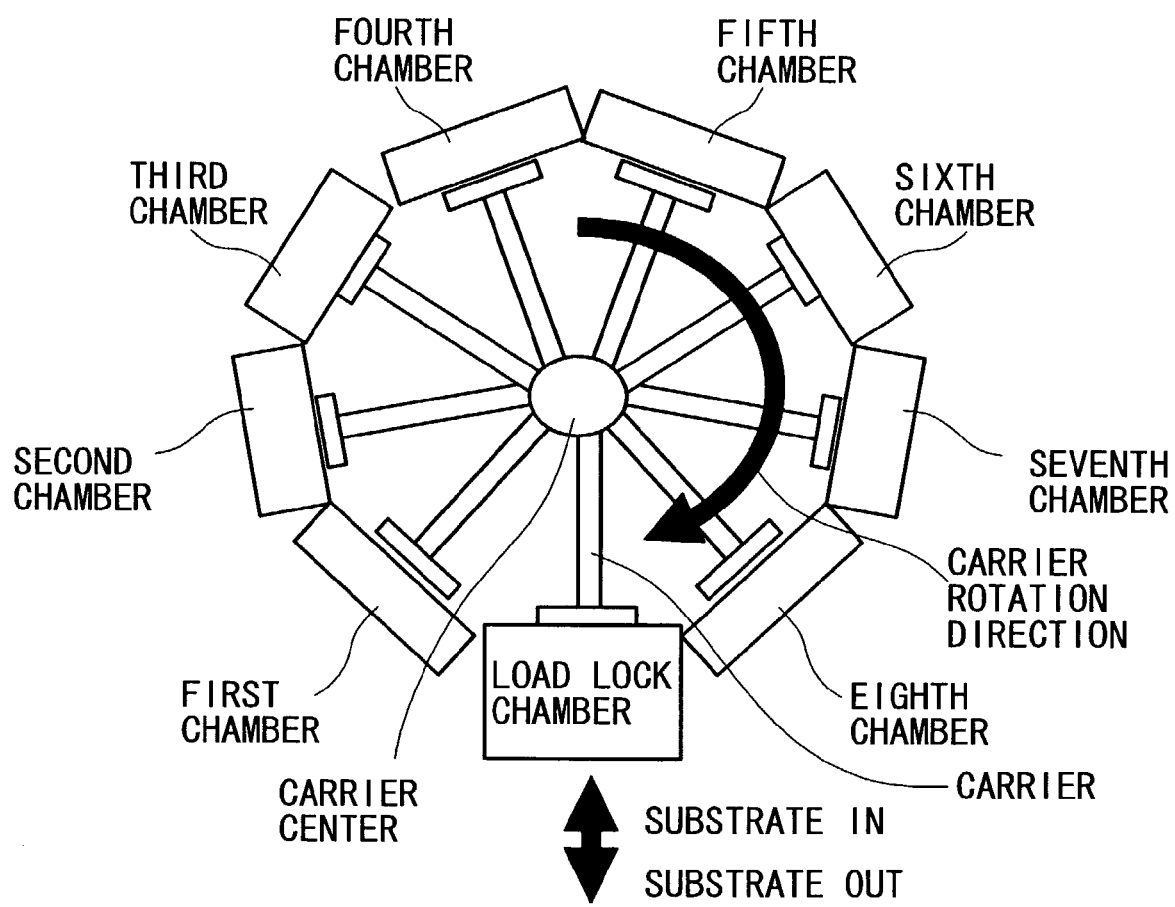
FIG. 9 is an illustrative drawing of the sputtering apparatus used in an example of the present invention.
Figure 10:
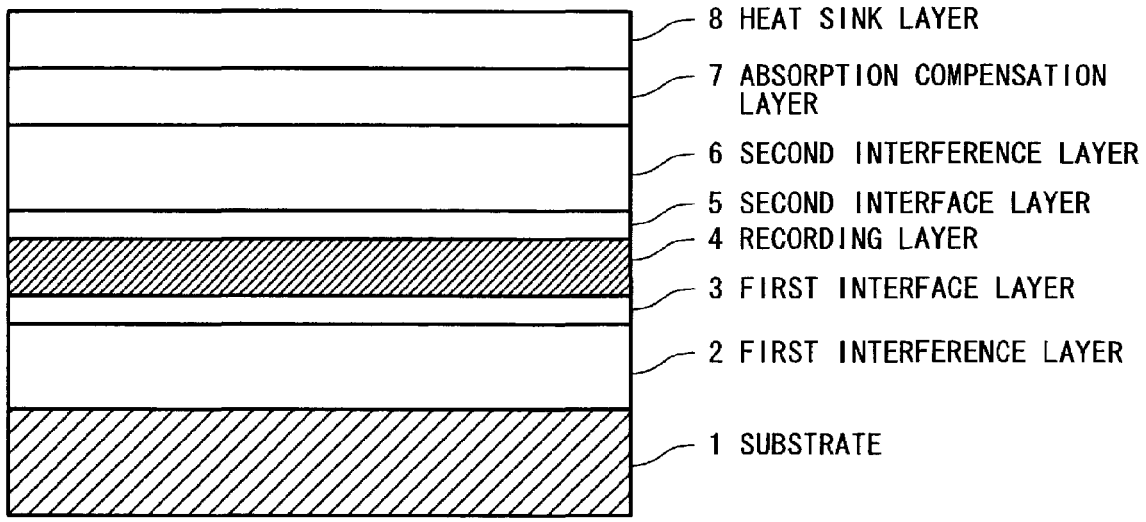
FIG. 10 is a drawing illustrating the medium of prior DVD-RAM.

The structure of the sputtering apparatus used for manufacture of the information recording media of the present invention will be explained with reference to FIG. 9. This sputtering apparatus is provided with nine chambers in the total. Eight of these chambers are process chambers named from the first chamber to the eighth chamber which are used for the film-making process. Apart from them, there is provided one load lock chamber for transporting the information recording media having been made into film out of the sputtering apparatus. This sputtering apparatus is provided with carriers of which number is the same as the number of chambers, and the carriers are rotated around the carrier centers in the direction of arrow to transport the substrates into the chambers.

Each process chamber is provided with a sputtering power source, a plurality of sputtering gas pipings, a mass flow controller for controlling the sputtering gas flow rate, etc. When each substrate is set to respective chamber, a sputtering gas suitable for each chamber is introduced into each chamber, and thereafter sputtering is carried out in each chamber. The carrier for transporting each substrate is provided with a small-sized vacuum motor for rotating the substrate. Since an electric source cable cannot be used as the power source for the motor, there is given a consideration so as to supply electricity from the contact part between carrier and chamber, just simultaneously with setting of each carrier to each chamber. By rotating the substrate, uniformity of composition and evenness of thickness of the layers formed on the substrate can be improved greatly. Since this sputtering apparatus is so constructed as to introduce He gas for cooling the substrate into the gap between substrate and carrier for the purpose of preventing excessive heating of substrate in the process of sputtering, the deformation of substrate caused by excessive heating of substrate can be prevented usually.

Production Example 1 of Information Recording Medium

In the usual sputtering processes, substrate is heated due to glow discharge occurring at the time of film making and the collision of sputtered flying particles against the substrate. The deformation of substrate caused by excessive heating is usually prevented by the above-mentioned methods. However, in the manufacture of the structure of Comparative Example 1, there occurred a trouble that the substrate was deformed and the transportation of substrate in the sputtering apparatus became impossible. In order to solve this problem, a cooling period for cooling the substrate was inserted after the sputtering in each chamber, to prevent the excessive heating of substrate. This problem will be explained below in detail.

On a polycarbonate-made substrate for land-groove recording having a thickness of 0.6 mm and having a track pitch of 0.615 μm and a groove depth of 65 nm in which address informations for recording information on both of land and groove were provided on the tip of each sector, the following thin-film-form layers were laminated: a first interference layer $(ZnS)_{80}(SiO_2)_{20}$ (thickness 124 nm), a first interface layer $Cr_2O_3$ (3 nm), a recording layer 3: $Ge_{28}Sb_{18}Te_{54}$ (8 nm), a second interface layer: $Cr_2O_3$ (3 nm), a second interference layer: $(ZnS)_{80}(SiO_2)_{20}$ (30 nm), absorption compensation layer: $Cr_{90}(Cr_2O_3)_{10}$ (30 nm), and a heat sink layer: $Al_{99}Ti_1$ (50 nm). The sputtering apparatus used herein was that having eight process chambers as mentioned above. The sputtering conditions at the time of film-making of the layers were as shown in FIG. 4.

In the manufacture of an information recording medium having the above-mentioned structure, the process for film-making of the first interference layer $(ZnS)_{80}(SiO_2)_{20}$ took too long a period of time because the layer had so great a thickness as 124 nm, which resulted in a delay in the time of starting of transportation of substrate by carrier, and as its result the period of time necessary for producing one sheet (the so-called cycle time) became long. Accordingly, it was more advantageous to divide this layer into two chambers to form the first interference layer into a film of half thickness (62 nm). By taking such a measure, the film-making time in the first and second chambers could be shortened to 4 seconds. However, since a long sputtering time usually causes deformation of substrate due to the heat generated at the time of sputtering, it was unavoidable in the experiment of this Example to design a long cooling time of 6 seconds in the first chamber, as a result of which the period of time for producing one sheet (the so-called cycle time) was 11.5 seconds which was a sum of sputtering time (4 seconds), cooling time (6 seconds) and transportation time (1.5 seconds).

Production Example 2 of Information Recording Medium

On a polycarbonate-made substrate for land-groove recording having a thickness of 0.6 mm and having a track pitch of 0.615 μm and a groove depth of 65 nm in which address information for recording information on both of land and groove were provided on the tip of each sector, the following thin-film-form layers were laminated: a first interference layer $(ZnS)_{80}(SiO_2)_{20}$ (thickness 123 nm), a first interface layer $Cr_2O_3$ (3 nm), a recording layer 3: $Ge_{28}Sb_{18}Te_{54}$ (8 nm), a protective layer: $(SnO_2)_{90}(ZnS)_{10}$ (33 nm), an absorption compensation layer: $Cr_{90}(Cr_2O_3)_{10}$ (30 nm), and a heat sink layer: $Al_{99}Ti_1$ (50 nm). The sputtering apparatus used herein was that having eight process chambers as mentioned above. The sputtering conditions at the time of film-making of the layers were as shown in FIG. 5.

In the manufacture of information recording medium having the above-mentioned structure, the number of lamination was 6, which was smaller by one layer than that in the lamination of 7 layers shown in FIG. 4, so that the number of chambers for film-making of the first interference layer $(ZnS)_{80}(SiO_2)_{20}$ was three chambers. By taking such a measure, the period of time necessary for film-making in the first, second and third chambers could be shortened to 2.6 seconds. Further, the sputtering time in the first and second chambers could also be shortened. Thus, the cooling time for cooling the substrate could be shortened to 2 seconds. As a result, the period of time necessary for production of one sheet (the so-called cycle time) could be shortened to 6.1 seconds (the sum of sputtering time 2.6 seconds, cooling time 2 seconds and transportation time 1.5 seconds). Thus, the cycle time in this case was about a half of that in <Production Example 1 of Information Recording Medium>.

Production Example 3 of Information Recording Medium

On a polycarbonate-made substrate for land-groove recording having a thickness of 0.6 mm and having a track pitch of 0.615 μm and a groove depth of 65 nm in which address informations for recording information on both of land and groove were provided on the tip of each sector, the following thin-film-form layers were laminated: a third interference layer: $(SnO_2)_{95}(Sb_2O_3)_5$ (76 nm), a first interference layer $(ZnS)_{80}(SiO_2)_{20}$ (47 nm), a first interface layer $Cr_2O_3$ (3 nm), a recording layer 3, $Ge_{28}Sb_{18}Te_{54}$ (8 nm), a second interface layer: $Cr_2O_3$ (3 nm), a second interference layer: $(ZnS)_{80}(SiO_2)_{20}$ (30 nm), an absorption compensation layer: $Cr_{90}(Cr_2O_3)_{10}$ (30 nm), and a heat sink layer: $Al_{99}Ti_1$ (50 nm). The sputtering apparatus used this time was that having eight process chambers as mentioned above. The sputtering conditions at the time of film-making of the layers were as shown in FIG. 6.

In the manufacture of information recording medium having the above-mentioned structure, the number of layers was 8, which is larger than even in the case shown in FIG. 5. Nevertheless, the cycle time could be shortened ultimately. This structure is characterized in having the third interference layer newly between the first interference layer and the substrate. The inventors considered that, by replacing the RF sputtering target usually used for film-making of the first interference layer with a DC source, the glow discharge will be confined into vicinity of sputtering target, and by taking such a measure the excessive heating of substrate will be prevented. It was further considered that the sputtering power will be increased and at the same time the sputtering rate will be improved by using the DC source. An improvement in sputtering rate brings about shortening of sputtering time, and as its result excessive heating of substrate will be prevented.

Based on such an idea, the inventors watched the sputtering target for film-making of the third interference layer and searched for a transparent material enabling DC sputtering. As a result, it was found that, when $Sb_2O$ was added to $SnO_2$ in a prescribed proportion, the electric resistance of sputtering target dramatically decreased to make it possible to carry out DC sputtering and to show excellent performance as an interference layer for optical disk.

As shown in FIG. 6, although the number of layers was increased to 8, the film-making times in the 1st and 23rd chambers could be shortened to 3.0 seconds. Further, since the sputtering time in the 1st and 2nd chambers could be shortened, it became possible to shorten the cooling time for cooling the substrate to 4.2 seconds. As its result, the production time per one sheet (the so-called cycle time) came to 8.7 seconds which was a sum of sputtering time (3.0 seconds), cooling time (4.2 seconds) and time period necessary for transportation of substrate (1.5 seconds). This cycle time is about 70% of the cycle time in <Production Example 1 of Information Recording Medium>.

Production Example 4 of Information Recording Medium

In this example, a third interference layer was applied to a case of using the protective layer of FIG. 5, in the same manner as in FIG. 6, and the cycle time-shortening effect was investigated. The result was as shown in FIG. 7.

On a polycarbonate-made substrate for land-groove recording having a thickness of 0.6 mm and having a track pitch of 0.615 μm and a groove depth of 65 nm in which address informations for recording information on both of land and groove were provided on the tip of each sector, the following thin-film-form layers were laminated: a third interference layer: $(SnO_2)_{95}(Sb_2O_3)_5$ (94 nm), a first interference layer: $(ZnS)_{80}(SiO_2)_{20}$ (30 nm), a first interface layer, $Cr_2O_3$ (3 nm), a recording layer 3, $Ge_{28}Sb_{18}Te_{54}$ (8 nm), a protective layer: $(SnO_2)_{90}(ZnS)_{10}$ (33 nm), an absorption compensation layer: $Cr_{90}(Cr_2O_3)_{10}$ (30 nm), and a heat sink layer: $Al_{99}Ti_1$ (50 nm). The sputtering apparatus used herein was that having eight process chambers as mentioned above. The sputtering conditions at the time of film-making of the layers were as shown in FIG. 7.

As shown in FIG. 7, the film-making times in the 1st and 2nd chambers could be shortened to 1.9 seconds. Further, since the sputtering times in the 1st and 2nd chambers could be shortened, the cooling time for cooling the substrate could be shortened to 1.5 seconds. As a result, the production time per one sheet (the so-called cycle time) came to 4.9 seconds which was a sum of sputtering time (1.9 seconds), cooling time (1.5 seconds) and substrate-transportation time (1.5 seconds). Thus, the cycle time could be shortened to about 40% of that in <Production Example 1 of Information Recording Medium>.

Example 4

Figure 8:
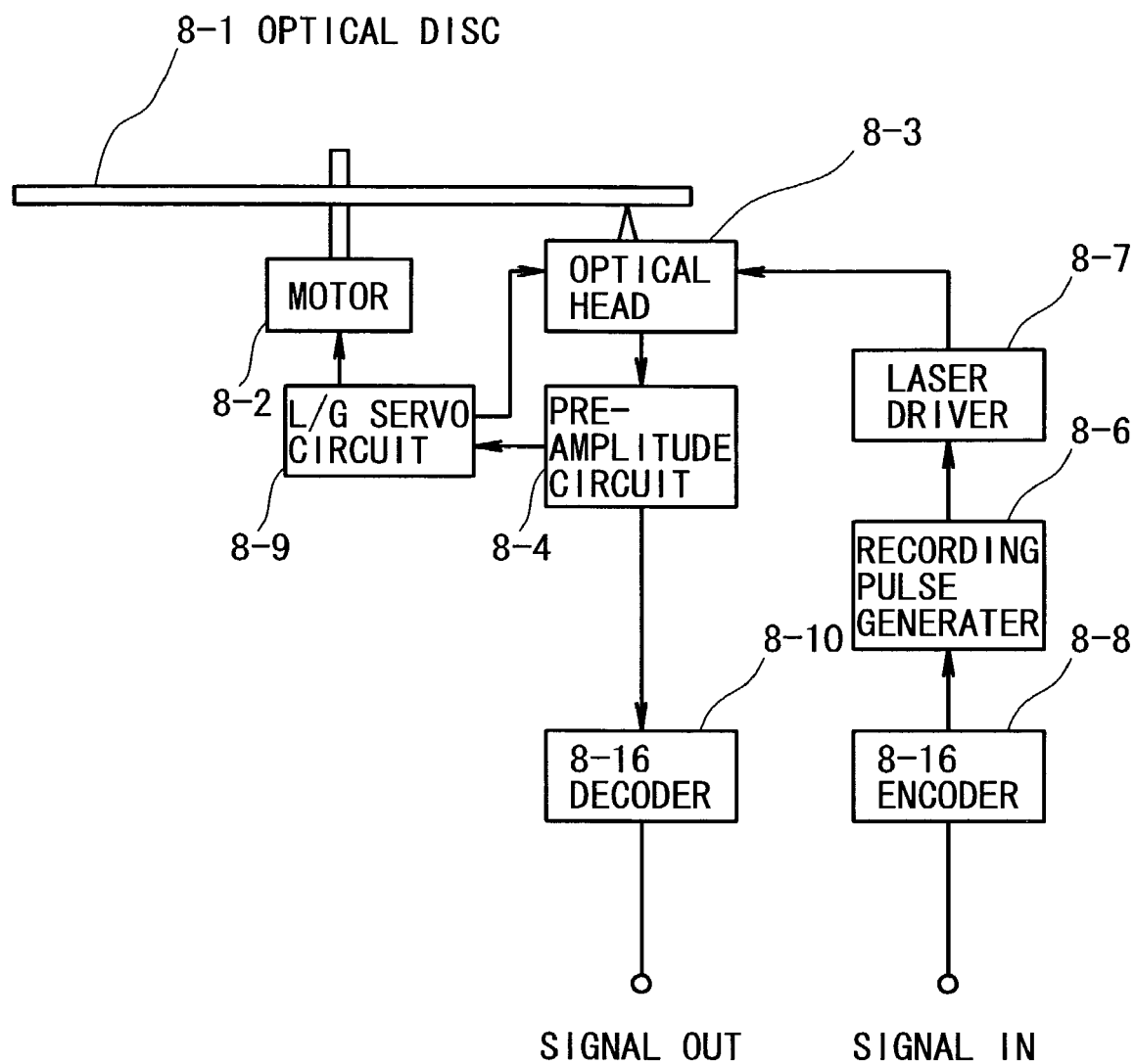
FIG. 8 is a block drawing illustrating the information recording apparatus used in an example of the present invention.

Next, the manner in which the recording and regeneration of information are carried out and the apparatus works according to the present invention will be described with reference to FIG. 8. As the method for controlling the motor at the time of recording and regeneration, the ZCLV (Zone Constant Linear Velocity) method which varies the rotation number of disk for every zone of carrying out recording and regeneration is used. The linear velocity of disk is about 8.2 m/second.

The information brought about from outside of recording apparatus is transferred to 8–16 encoder 8-8, provided that 8 bits are taken as one unit. At the time of recording an information on the information recording medium (hereinafter, referred to as optical disk) 8-1, the recording is carried out according to the 8–16 encoding method which modulates 8 bits of information to 16 bits. In this encoding method, an information having a mark length of 3T to 14T corresponding to 8 bits information is recorded on the medium. In FIG. 8, the 8–16 encoder carries out this encoding. Herein, T means the period of clock at the time of recording an information, which is taken as 17.1 ns in this experiment.

The digital signals of 3T to 14T which have been encoded by the 8–16 encoder 8-8 are sent to recording pulse generator 8-6, where the width of high power pulse is converted to about T/2. A lower power level of laser having a pulse width of about T/2 is irradiated between irradiations of the high power level laser to form a multi pulse recording wave in which a laser irradiation of intermediate power level is carried out between a series of the above-mentioned high power pulses. At this time, the high power level for forming recording marks is adjusted to 10.0 mW, and the intermediate power level enabling deletion of record marks is adjusted to 4.0 mW. In the above-mentioned recording pulse generator 8-6, the signals 3T–14T are alternately made to correspond to [0] and [1] in the lapse of time. Thus, at the time of [0], a laser power of intermediate power level is irradiated, while at the time of [1] a series of high power pulses containing high power level pulses are irradiated. On the light disk 1, the sites irradiated with a laser beam of intermediate power level become crystalline (space part), and the sites irradiated with a laser beam of a series of high power pulses containing pulses of high power level change to amorphous region (mark part). The inner part of the above-mentioned recording pulse generator 8-6 has a multi pulse table corresponding to the adaptive recording pulse controlling method (a method of changing the width of the leading pulse and the width of the last pulse of a multi pulse wave in accordance with the space lengths before and after the mark part at the time of forming a series of high power pulse sequence containing a high power level for forming mark parts), and thereby emits a multi-pulse record pulse capable of excluding the influence of thermal interference between marks arising between marks as possible.

The recording pulse generated by the recording pulse generator 8-6 is transferred to laser driver 8-7, and the laser driver 8-7 emits light from the semiconductor laser in the optical head 8-3 on the basis of the record pulse.

The optical head 8-3 mounted on this recording apparatus uses a semiconductor laser emitting a light having a wavelength of 655 nm as a laser beam for information recording. Information is recorded by focusing this laser light onto the recording layer of optical disk 8-1 by the use of an objective lens of lens NA 0.6, and irradiating it with a laser beam of a laser corresponding to the above-mentioned record pulse.

When a laser light of laser wavelength μ is focused by means of a lens having a lens opening number of NA, the spot diameter of laser beam comes to 0.9×μ/NA approximately. Accordingly, under the condition mentioned above, spot diameter of the laser beam is about 0.98 micron. At this time, the polarized light of laser beam is a circularly polarized light.

Further, this recording apparatus is adaptable also to the so-called land-groove recording method (the method of making record on both of groove and land (the region between grooves)). In this recording apparatus, trackings for land and groove can be arbitrarily selected by the L/G servo circuit 8-9. The recorded information can be regenerated with the above-mentioned optical head 8-3. A regenerated signal can be obtained by projecting a laser beam onto the recorded mark, and detecting the reflected light from the mark and that from the area other than mark. Amplitude of the regenerated signal is amplified with pre-amplitude circuit 8-4, and sent to 8–16 decoder 8-10. In the 8–16 decoder 8-10, every 16 bits is converted to a 8 bits information. By the above-mentioned procedure, regeneration of the recorded mark is completed. When recording is carried out on the above-mentioned optical disk 8-1 under the above-mentioned condition, the shortest mark (3T mark) has a mark length of about 0.42 μm, and the longest mark (14T mark) has a mark length of about 1.96 μm.

Example 5

Herein are mentioned the optimum composition and optimum film thickness of the layers used in the information recording media of the present invention.

(Third Interference Layer)

Usually, the material existing on the light-incidence side of third interference layer is an organic material such as a plastic material made of polycarbonate, an ultraviolet-curable resin, or the like. These materials have a refractive index of from about 1.4 to about 1.6. In order to cause a reflection effectively between the organic material and the third interference layer, it is desirable that the third interference layer has a refractive index of 2.0 or above. From the optical viewpoint, the third interference layer has a refractive index not smaller than that of the material existing on the light-incidence side (in this example, the substrate), and a greater refractive index thereof is better so long as no absorption of light takes place. More concretely speaking, it is preferable that the refractive index n is in the range of 2.0 to 3.0 and it is preferable that the material is a material not absorbing light. From the viewpoint of productivity, it is preferable that the material comprises $SnO_2$ and $SbO_3$ or $Bi_2O_3$. As for the composition ratio, a $SnO_2$ content of 90–97 mol % is best, because such a composition ratio enables DC sputtering and is most suitable for mass production. If $SnO_2$ content is higher than 97 mol %, the electric resistance cannot be sufficiently low. If $SnO_2$ content is lower than 90 mol %, there is a problem that absorption rate increases and heat stability is low.

(First Interference Layer)

If the third interference layer does not exist between substrate and the first interference layer, the material existing on the light-incidence side of the first interference layer is an organic material such as polycarbonate or other plastic substrate or an ultraviolet-curable resin. These materials have a refractive index of about 1.4 to about 1.6. For effectively causing reflection between the above-mentioned organic material and the first interference layer, it is preferable that the first interference layer has a refractive index of 2.0 or higher. From the optical point of view, the first interference layer has a refractive index not smaller than that of the material existing on the light-incidence side (in this example, the substrate), and a greater refractive index is better so far as no absorption of light takes place. More concretely speaking, it is preferable that the refractive index n is in the range of 2.0 to 3.0 and the material does not absorb light, and especially the material contains oxide, carbide, nitride, sulfide or selenide of metal. It is also preferable that the heat conductivity is not greater than 2 W/mk. The compounds of $ZnS$—$SiO_2$ type are most suitable for use as the first interference layer because of low heat conductivity. For effectively utilizing the optical interference between substrate and recording layer, the optimum film thickness of the first interference layer is 110–135 nm when the wavelength of laser is about 650 nm.

(First Interface Layer)

As the material of the first interface layer, oxides or nitrides of transition metal elements readily forming an atomic ratio-variable compound or mixtures of such elements are particularly excellent. Further, oxides and nitrides of semiconductors such as Si, Ge and the like are also excellent because they readily give an atomic ratio-variable compounds. Concretely speaking, oxides and nitrides of Ti, V, Cr, Mn, Fe, Co, Ni, Cu, Y, Zr, Nb, Mo, Tc, Hf, Ta, W, La, Ce and the like and mixtures thereof are suitable for this purpose. Especially suitable are oxides such as Cr—O type materials and Co—O type materials ($Co_2O_3$, CoO, etc.), nitrides such as Ta—N type materials, Al—N type materials, Si—N type materials, Al—Si—N type materials (for example, $AlSiN_2$), Ge—N type materials and the like, carbides such as SiC, GeC and the like, and mixtures of these materials. Metal tellurides, semiconductor tellurides and nitrides of these tellurides are also suitable. In these cases, the nucleus-forming velocity of recording film is improved, due to which there is obtained an effect of improving the shelf life and deletion characteristics at the time of overwriting.

Since the above-mentioned materials absorb light usually, they cannot give an optically good result. However, since they are excellent in the effect of preventing release of film, improving the shelf life and preventing the deterioration in overwrite cycle times, their existence in the first interface layer is practically desirable. Accordingly, a smaller thickness of the first interface layer is more desirable so far as the above-mentioned effects are not lost. According to the result of an investigation of the present inventors, a sufficiently good result is obtained when film thickness of the first interface layer is 0.5 nm or above. A film thickness exceeding 5 nm is disadvantageous because it causes a decrease in reflectivity and a drop in signal amplitude. A film thickness exceeding 20 nm is impractical because of decrease in reflectivity and a great drop in signal amplitude. Accordingly, the film thickness of the first interface layer should be not smaller than 0.5 nm and not larger than 20 nm, and preferably not smaller than 0.5 nm and not larger than 5 nm.

(Recording Layer)

As the recording layer material used in the present invention, phase-change recording materials are especially suitable. As the recording layer materials which can be used in place of the $Ge_{28}Sb_{18}Te_{54}$ used in the above-presented examples, materials having a composition comprising 25–38 atomic % of Ge, 13–20 atomic % of Sb and 50–55 atomic % of Te have been found to be especially suitable because such materials are not readily susceptible to deterioration in overwrite cycle times. When SnTe is added in an amount of 1–15 mol %, shelf life of the information recording medium of the present invention is improved.

When the film thickness of recording layer is not greater than the level different between land and groove, namely depth of groove, the cross erase-reducing effect is high. When film thickness of recording layer is 4–20 nm, a good result is obtained because degree of modulation is great and flow of recording film does not take place readily. When film thickness is 4–10 nm, a better result is obtained. When film thickness of recording layer is smaller than 4 nm, reflectivity and signal amplitude decrease greatly, but the overwrite jitter preventing effect and the recording film flow preventing effect at the time of repeated overwriting for many times are high. When film thickness of recording layer is greater than 10 nm, reflectivity and signal amplitude are good, but troubles such as a rise in overwrite jitter and the flow of recording film at the time of overwriting for many times appear markedly. In this example, information is recorded on an optical disk of which recording film is made of a high-melting recording layer material having a melting point of 630° C. or above. However, it is not always necessary that melting point of recording film is 630° C. or above, because the fundamental of the present invention consists in enhancing the heat stability in the neighborhood of recording layer in an optical disk which carries out recording of record mark by the action of heat generated by a laser beam.

(Protective Layer)

When $SnO_2$, a sulfide and a transition metal oxide are mixed together at a prescribed ratio, heat conductivity of the mixture is so low as comparable to that of $ZnS$—$SiO_2$, and such a mixture is preferable because the mixture exhibits a high sputtering rate and a high transparency, is thermally stable, and exhibits a good heat stability even when a phase-change material giving a melting point of 630° C. or above is used as a recording layer. Particularly when its tin content is 23.3–32.3 atomic % (70–97 mol % as expressed in terms of $SnO_2$ content), deterioration of regenerating signal can be suppressed to a practical level even if recording of information is repeated so many times as 100,000 times.

As a result of extensive studies, the present inventors have found that the above-mentioned effect can be exhibited especially markedly when a sulfide and a transition metal oxide are added to $SnO_2$. Concretely, sulfides of Zn, Sb, Au, Ag, Si, Ge, Co, Sn, C, Ta, Fe, Cu, Nb, Ni, V, Ba, Bi, Mn, Mo and the like and oxides of transition metals such as Ti, V, Cr, Mn, Fe, Co, Ni, Cu, Zr, Nb, Mo, Ta, W and the like are preferable.

This is for the reason that Sn is trapped when Sn in $SnO_2$ is liberated from oxygen by the action of heat generated at the time of information recording. Particularly a protective layer in which the mixing ratio between $ZnS$ and $SnO_2$ is changed is most suitable for use as a protective layer because heat conductivity decreases greatly. Further, film thickness of the protective layer is preferably about 25 to 200 nm. It is more desirable that the film thickness is not smaller than the level difference between land and groove (depth of groove on substrate, about ⅐ to ⅕ of laser wavelength). It is also possible that the summed film thickness of protective layer and absorption compensation layer is not smaller than the level difference between land and groove. When film thickness of protective layer is 25 nm or less or when the summed film thickness of protective layer and absorption compensation layer is not greater than the level difference between land and groove, there arises a trouble that the heat generated upon recording on the recording layer is diffused through the heat sink layer and the record mark recorded on the adjacent track is apt to be deleted, namely cross erase is apt to occur. When film thickness of protective layer is 200 nm or above, a disadvantage that the velocity of cooling in the recording layer at the time of information recording becomes very small so that formation of amorphous state becomes difficult (formation of a recording mark becomes difficult) appears, and at the same time there arises a problem that the distribution of reflectivity in the disk surface becomes excessively great because of distribution of film thickness of the protective layer in the optical disk surface at the time of production.

(Absorption Compensation Layer)

In DVD-RAM, the amplitude of regenerated signal is small, and therefore the deterioration of regenerated signal caused by the undeleted residue generated at the time of overwriting has to be prevented as possible. For this purpose, an absorption compensation layer is provided between a heat sink layer and a second interference layer.

The absorption compensation layer is preferably made of a material of which complex index of refraction n, k satisfies $1.4<n<4.5$ and $-3.5<k<-0.5$, and particularly $2<n<4$ and $-3.0<k<-0.5$. Since absorption compensation layer absorbs light, this layer is preferably constituted of a thermally stably material, and it is required that melting point thereof is 1,000° C. or higher. In the case of protective layer, an especially remarkable cross-erase-reducing effect is exhibited when a sulfide layer is added to protective layer, as has been mentioned above. On the other hand, in the case of absorption compensation layer, it is preferable that the content of sulfide such as ZnS or the like in this layer is smaller than the content of sulfide added to the protective layer, because bad influences such as drop in melting point, decrease in heat conductivity, decrease in absorption rate, etc. can appear unless this condition is not satisfied. The absorption compensation layer is preferably composed of a mixture of a metal and a metal oxide, metal sulfide, metal nitride or metal carbide, and a mixture of Cr and $Cr_2O_3$ exhibits a particularly good improving effect on overwrite characteristics. Particularly when Cr content is 60–95 atomic %, a material having heat conductivity and optical constants suitable for the present invention can be obtained. Concretely speaking, the metal is preferably selected from Al, Cu, Ag, Au, Pt, Pd, Co, Ti, Cr, Ni, Mg, Si, V, Ca, Fe, Zn, Zr, Nb, Mo, Rh, Sn, Sb, Te, Ta, W, Ir and Pb mixture. As said metal oxide, metal sulfide, metal nitride and metal carbide, $SiO_2$, SiO, $TiO_2$, $Al_2O_3$, $Y_2O_3$, CeO, $La_2O_3$, $In_2O_3$, GeO, $GeO_2$, PbO, SnO, $SnO_2$, $Bi_2O_3$, $TeO_2$, $MO_2$, $WO_2$, $WO_3$, $Sc_2O_3$, $Ta_2O_5$ and $ZrO_2$ are particularly preferable. Apart from the above, it is also possible to use an absorption compensation layer using oxides including Si—O—N type material, Si—Al—O—N type material, Cr—O type material such as $Cr_2O_3$ and the like and Co—O type material such as $Co_2O_3$, CoO and the like; nitrides including Si—N type material such as TaN, AlN, $Si_3N_4$ and the like, Al—Si—N type material (for example, $AlSiN_2$), Ge—N type material and the like; sulfides such as ZnS, $Sb_2S_3$, CdS, $In_2S_3$, $Ga_2S_3$, GeS, $SnS_2$, PbS, $Bi_2S_3$ and the like; selenides such as $SnSe_3$, $Sb_2Se_3$, CdSe, ZnSe, $In_2Se_3$, $Ga_2Se_3$, GeSe, $GeSe_2$, SnSe, PbSe, $Bi_2Se_3$ and the like; fluorides such as $CeF_3$, $MgF_2$, $CaF_2$ and the like; or a material having a composition close to the above-mentioned ones.

Film thickness of the absorption compensation layer is preferably not smaller than 10 nm and not larger than 100 nm, and a particularly good overwrite characteristics-improving effect can be exhibited when the film thickness is not smaller than 20 nm and not larger than 50 nm. A cross-erase-reducing effect is markedly exhibited when the summed film thickness of protective layer and absorption compensation layer is not smaller than the groove depth. Since the absorption compensation layer has a light-absorbing property as has been mentioned above, the absorption compensation layer also absorbs light to generate heat, similarly to recording layer which absorbs light to generate heat. It is important to make the absorption rate in the absorption compensation layer exhibited when the recording layer is in an amorphous state greater than that exhibited when the recording layer is in a crystalline state. By such an optical design, there can be exhibited an effect of making the absorption rate Aa (absorption rate in recording rate exhibited when the recording layer is in an amorphous state) smaller than Ac (that exhibited when the recording layer is in a crystalline state). Due to this effect, the overwrite characteristics can be improved greatly. For obtaining the above-mentioned effect, the absorbing rate in the absorption compensation layer must be enhanced to about 30–40%. The quantity of heat generated in the absorption compensation layer varies depending on whether the recording layer is in a crystalline state or in an amorphous state. As its result, the flow of heat from recording layer to heat sink layer varies depending on the state of recording layer, and the rise in jitter due to overwrite can be suppressed by utilizing this phenomenon.

The above-mentioned effect is exhibited by an effect that the heat flow from recording layer to heat sink layer is intercepted by a rise of temperature in the absorption compensation layer. For utilizing this effect effectively, it is desirable that the summed film thickness of protective layer and absorption compensation layer is not smaller than the level difference between land and groove (groove depth on the substrate, about 1/7 to 1/5 of the laser wavelength). When the summed film thickness of protective layer and absorption compensation layer is smaller than the level difference between land and groove, the heat generated at the time of recording on the recording layer is diffused through the heat sink layer to make the record marks recorded on the adjacent track easy to delete.

(Heat Sink Layer)

As the heat sink layer material, a metal or an alloy having a high heat conductivity is preferably used. Preferably, the total content of Al, Cu, Ag, Au, Pt and Pd in the heat sink layer material is 90 atomic % or more. A material having a high melting point and a high hardness such as Cr, Mo, W or the like and alloys thereof are also preferable, because such materials can prevent the deterioration of recording layer material caused by the flow at the time of many times-repeated overwriting. Particularly, a material containing Al in an amount of 95 atomic % or more is excellent as a heat sink layer material because of low price, high CNR, high recording sensitivity and high durability to many times-repeated overwriting and such a material is capable of giving an information recording medium very high in cross erase-reducing effect. Particularly when a heat sink layer material of the above-mentioned composition contains Al in an amount of 95 atomic % or more, an information recording medium low in price and excellent in corrosion resistance can be realized. As the elements added to Al, Co, Ti, Cr, Ni, Mg, Si, V, Ca, Fe, Zn, Zr, Nb, Mo. Rh, Sn, Sb, Te, Ta, W, Ir, Pb, B and C are excellent in the point of corrosion resistance. When the element added is Co, Cr, Ti, Ni or Fe, there is exhibited a particularly great improving effect on corrosion resistance. Film thickness of the heat sink layer is preferably not smaller than 30 nm and not larger than 100 nm. If film thickness of heat sink layer is smaller than 30 nm, the heat generated in the recording layer is not readily diffused, so that the recording layer is apt to be deteriorated particularly when the overwriting is repeated about 100,000 times, and cross erase is apt to take place. In addition, such a heat sink layer allows permeation of light, its use as a heat sink layer is difficult and the amplitude of regenerated signal can drop. When one metallic element is used in both the absorption compensation layer and the heat sink layer, there is a great merit from the viewpoint of manufacture because the absorption compensation layer and the heat sink layer can be made into film by the use of one target. That is to say, at the time of making a film of absorption compensation layer, sputtering is carried out with a mixed gas such as Ar—$O_2$ mixed gas, Ar—$N_2$ mixed gas or the like and a metallic element and oxygen and nitrogen are reacted during the sputtering to form an absorption compensation layer of appropriate refractive index; and at the time of making a film of heat sink layer, sputtering is carried out with Ar gas to form a heat sink layer of a metal having a high heat conductivity.

If film thickness of the heat sink layer is larger than 200 nm, productivity is not good, warpage of substrate occurs due to internal stress of heat sink layer, and recording and regeneration of information cannot be carried out exactly. So far as film thickness of heat sink layer is not smaller than 30 nm and not larger 90 nm, corrosion resistance and productivity are both excellent, so that such a film thickness is further more desirable.

It should be further understood by those skilled in the art that although the foregoing description has been made on embodiments of the invention, the invention is not limited thereto and various changes and modifications may be made without departing from the spirit of the invention and the scope of the appended claims.

EFFECT OF THE INVENTION

By adopting the above-mentioned constitution, the deterioration of regenerated signal can be kept on a practical level even after repeating the recording of information 100,000 times, and a many times-repeated overwriting can be realized.

What is claimed is:

1. An information recording medium having:
   a substrate,
   a recording layer being capable of recording information by a phase-change reaction caused by irradiation of a laser beam and capable of being overwritten many times, said recording layer containing at least germanium, antimony and tellurium, and
   (1) a first layer made of $SnO_2$—ZnS based material wherein a content of tin is not lower than 23.3 atomic % but not higher than 32.3 atomic %, provided that said first layer is in contact with said recording layer,
   wherein a thickness of said first layer is more than 25 nm but less than 200 nm or not smaller than a level difference between a land and a groove of the recording medium.

2. The information recording medium according to claim 1, wherein said substrate has groove-like concavity and convexity thereon and both the concavity and the convexity are provided with a recording track for recording information.

3. The information recording medium according to claim 1, wherein said recording layer contains at least germanium, antimony and tellurium, provided that a content of said antimony is not higher than 20 atomic % and a content of said germanium is not lower than 25 atomic %.

4. The information recording medium according to claim 1, wherein a substrate, said first layer, said recording layer, an interface layer, an interference layer, an absorption compensation layer and a heat sink layer are successively formed in said medium, as seen from a light-incidence side.

5. The information recording medium according to claim 1, wherein a substrate, an interference layer, an interface layer, said recording layer, said first layer, an absorption compensation layer and a heat sink layer are successively formed in said medium, as seen from a light-incidence side.

6. The information recording medium according to claim 1, wherein the following components are successively formed in said medium, as seen from a light-incidence side:
   a substrate,
   said first layer,
   said recording layer,
   (4) a second layer containing a transition metal element, oxygen and tin wherein a content of tin is not lower than 23.3 atomic % but not higher than 32.3 atomic %, or (5) a second layer containing a transition metal element, sulfur, oxygen and tin wherein a content of tin is not lower than 23.3 atomic % but not higher than 32.3 atomic %, or (6) a second layer containing zinc, sulfur, oxygen and tin wherein a content of tin is not lower than 23.3 atomic % but not higher than 32.3 atomic %, provided that said second layer (4), (5) or (6) is provided in contact with said recording layer, an absorption compensation layer, and a heat sink layer.

7. A method for manufacturing a medium comprising the steps of:

forming an interference layer on a substrate, forming an interface layer on said interference layer, forming a recording layer containing at least germanium, antimony and tellurium, on said interface layer, forming, on said recording layer, a protective layer made of $SnO_2$—ZnS based material wherein a content of tin is not lower than 23.3 atomic % but not higher than 32.3 atomic %, forming an absorption compensation layer on said protective layer, and forming a heat sink layer on said absorption compensation layer, wherein a thickness of said first layer is more than 25 nm but less than 200 nm or not smaller than a level difference between a land and a groove of the recording medium.

8. The method according to claim 7, wherein said interference layer is formed in a plurality of chambers.

9. The method according to claim 8, wherein said interference layer is formed in said plurality of chambers by means of RF sputtering.

10. The method according to claim 7, wherein said interference layer is formed by means of DC sputtering.

11. The method according to claim 10, wherein said interference layer is constituted of two kinds of layers made of two kinds of materials and one layer of the two kinds of layers is formed by means of said DC sputtering.

12. The method according to claim 11, wherein the other layer of the two kinds of layers is formed by means of RF sputtering.

* * * * *